United States Patent
Kappes et al.

(10) Patent No.: US 10,498,350 B2
(45) Date of Patent: *Dec. 3, 2019

(54) MULTI-NYQUIST ZONE DIGITAL-TO-ANALOG CONVERTER (DAC)

(71) Applicant: IQ-Analog Corporation, San Diego, CA (US)

(72) Inventors: Michael Kappes, San Diego, CA (US); Steven R. Norsworthy, Cardiff, CA (US); Costantino Pala, San Diego, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/012,858

(22) Filed: Jun. 20, 2018

(65) Prior Publication Data

US 2019/0013821 A1 Jan. 10, 2019

Related U.S. Application Data

(63) Continuation of application No. 15/787,298, filed on Oct. 18, 2017, now Pat. No. 10,033,398, which is a (Continued)

(51) Int. Cl.
*H03M 1/66* (2006.01)
*H03M 1/12* (2006.01)
(Continued)

(52) U.S. Cl.
CPC .......... *H03M 1/662* (2013.01); *H03M 1/121* (2013.01); *H04B 1/44* (2013.01); *G11C 27/02* (2013.01);
(Continued)

(58) Field of Classification Search
CPC .......... H03M 1/662; H03M 1/121; H04B 1/44
(Continued)

(56) References Cited

U.S. PATENT DOCUMENTS

| | | | | | |
|---|---|---|---|---|---|
| 5,155,584 | A | * | 10/1992 | Taguchi | .................. H04N 1/64 348/231.6 |
| 5,260,776 | A | * | 11/1993 | Taguchi | .................. H04N 1/64 348/E9.01 |

(Continued)

OTHER PUBLICATIONS

A. Baiteanu, et.al., "A 6-bit Segmented RZ DAC Architecture with up to 50-GHz Sampling Clock and 4 Vpp Differential Swing", IEEE Int. Microwave Symp. (IMS), 2012 IEEE.
(Continued)

*Primary Examiner* — Lam T Mai
(74) *Attorney, Agent, or Firm* — Law Office of Gerald Maliszewski; Gerald Maliszewski

(57) ABSTRACT

A multi-zone digital-to-analog device is provided with a digital-to-analog (D/A) stage having an input to accept a digital input signal with a data bandwidth of M Hertz (Hz), a clock input to accept a clock signal with a clock frequency of P Hz, and an output to supply an analog value having a bandwidth of M Hz. An upsampling stage has an input to accept the analog value and a clock input to accept the clock signal. The upsampling stage has a device bandwidth of L Hz to supply an analog output signal with a full power bandwidth of K Hz, where $(P/2)=M$ and $M<K<L$. The upsampling stage supplies analog output signal images in a plurality of Nyquist zones. In one aspect, the D/A stage supplies N deinterleaved analog values having a combined bandwidth of M Hz, where $N \times (P/2) = M$.

20 Claims, 13 Drawing Sheets

Related U.S. Application Data continuation-in-part of application No. 15/673,228, filed on Aug. 9, 2017, now Pat. No. 9,979,582.

(60) Provisional application No. 62/530,567, filed on Jul. 10, 2017.

(51) Int. Cl.

| | | |
|---|---|---|
| *H03M 1/06* | (2006.01) | |
| *H04B 1/44* | (2006.01) | |
| *H03L 7/08* | (2006.01) | |
| *G11C 27/02* | (2006.01) | |
| *H03L 7/081* | (2006.01) | |

(52) U.S. Cl.
CPC .............. *H03L 7/08* (2013.01); *H03L 7/0812* (2013.01); *H03M 1/06* (2013.01)

(58) Field of Classification Search
USPC .................................................. 341/126–144
See application file for complete search history.

(56) References Cited

U.S. PATENT DOCUMENTS

| | | | | |
|---|---|---|---|---|
| 7,283,076 | B1* | 10/2007 | Ding | H03H 17/0614 |
| | | | | 341/143 |
| 7,324,025 | B1* | 1/2008 | Ding | H03H 17/0671 |
| | | | | 341/118 |
| 7,564,892 | B1* | 7/2009 | Lidstrom | H04B 1/18 |
| | | | | 375/211 |
| 7,633,417 | B1* | 12/2009 | Yeh | H03M 3/50 |
| | | | | 341/131 |
| 8,401,108 | B1* | 3/2013 | Haddadin | H03C 1/00 |
| | | | | 375/295 |
| 9,979,582 | B1* | 5/2018 | Kappes | H03M 1/121 |
| 10,033,398 | B1* | 7/2018 | Kappes | H03M 1/121 |
| 2010/0027711 | A1* | 2/2010 | Manku | H03M 1/68 |
| | | | | 375/295 |

OTHER PUBLICATIONS

H. Huang, et.al, "An 8-bit 100-GS/s Distributed DAC in 28-nm CMOS for Optical . . . ", IEEE Transactions on Microwave Theory and Techniques, vol. 63, No. 4, pp. 1211-1218, Apr. 2018.

* cited by examiner

MULTI-NYQUIST ZONE DIGITAL-TO-ANALOG CONVERTER (DAC)

RELATED APPLICATIONS

Any and all applications, if any, for which a foreign or domestic priority claim is identified in the Application Data Sheet of the present application are hereby incorporated by reference under 37 CFR 1.57.

The following applications are also incorporated herein by reference:

N-PATH INTERLEAVING ANALOG-TO-DIGITAL CONVERTER (ADC) WITH BACKGROUND CALIBRATION, invented by Mikko Waltari, Ser. No. 14/531,371, filed Nov. 3, 2014, now U.S. Pat. No. 9,030,340;

INTERLEAVING ANALOG-TO-DIGITAL CONVERTER (ADC) WITH BACKGROUND CALIBRATION, invented by Mikko Waltari et al., Ser. No. 14/511,206, filed Oct. 10, 2014, now U.S. Pat. No. 8,917,125;

TIME-INTERLEAVED ANALOG-TO-DIGITAL CONVERTER FOR SIGNALS IN ANY NYQUIST ZONE, invented by Mikko Waltari, Ser. No. 13/603,495, filed Sep. 5, 2012, issued as U.S. Pat. No. 8,654,000 on Feb. 18, 2014.

CURRENT IMPULSE (CI) DIGITAL-TO-ANALOG CONVERTER (DAC), invented by Mikko Waltari, Ser. No. 14/750,203, filed Jun. 25, 2015, issued as U.S. Pat. No. 9,178,528 on Nov. 3, 2015.

BACKGROUND OF THE INVENTION

1. Field of the Invention

This invention generally relates to digital-to-analog converters (DACs) and, more particularly, to a system and method for efficiently converting digital signals to analog signals in higher order Nyquist zones.

2. Description of the Related Art

At the time of this writing, DACs with the widest signal bandwidth of greater than 50 gigasamples per second (Gsps) have been implemented using indium phosphorous (InP) or silicon germanium (SiGe) BiCMOS [1] technologies. While the availability of such heterojunction bipolar transistor (HBT) devices helps with the signal bandwidth, these technologies are not well suited for integration with digital logic. Interfacing high speed digital data into the DAC is a major system level challenge, and bringing the DAC into the same CMOS die with the digital signal processing (DSP) blocks would be highly desirable. It has been shown [2] that the most advanced CMOS nodes are suitable for designing DACs with record braking update rates, but signal bandwidth and linearity remain a big challenge.

Time interleaving is a concept widely used in high speed analog-to-digital converters (ADCs) to achieve a higher sampling rate than can be obtained using a single ADC core. The technique uses multiple slowly clocked ADCs that operate in parallel, and takes turns sampling the input and converting it to a digital value. With properly aligned sampling clock phases, the composite sampling rate is the sampling rate of the individual ADC core multiplied by the number of the cores used.

The same principle can be applied to DACs as well. The current steering DAC architecture, which is the most common choice in high speed applications, is inherently very fast and has conventionally been able to satisfy the needs of almost all applications. For that reason interleaving is not very widely used in DACs. Another important reason is that one cannot interleave just any kind of DAC because they have conventionally needed return-to-zero type output signals to provide the narrow signal pulses needed for interleaving. This means that although the update rate of the DAC core is relaxed due to interleaving, signals must be used with pulse widths similar to the clock period at the full rate.

FIG. 1A is a schematic depicting the general concept of an interleaved DAC, and FIG. 1B depicts associated waveforms (prior art). The waveforms show how four DACs generate quarter period long output pulses that are then added together to form the final composite output signal. The pulsed output signal of the DAC core goes to zero between the pulses, hence the name return-to-zero (RZ). This is necessary; as not zeroing the output would result in inter-symbol interference, which manifests itself in the frequency domain as a $\sin(x)/x$ response with zeros at fs/N, where N is the number of the interleaved channels. The RZ DACs are one type of zero-order hold DACs since they convert a discrete-time signal to a continuous-time signal by holding each sample value for one sample interval (clock period).

It can be argued that achieving a wide signal bandwidth is an even bigger challenge in very high speed DAC design than is realizing a faster update rate. The bandwidth is mainly limited by the capacitance at the output node. It is clear that interleaving, with many parallel DACs connected to the same output, simply increases the capacitance. Techniques such as adding a cascode stage after combining the currents, and design principles borrowed from distributed power amplifiers can be used to alleviate the bandwidth issue [1, 2]. Conventionally, keeping the interleaving factor low and having a DAC core with small output capacitance are both been considered essential design principles.

FIG. 2 is a schematic block diagram of a current impulse (CI) DAC (prior art). The CI DAC 200 comprises a first switched capacitor circuit 202 having an input on line 204 to accept a digital data bit, an input on line 206 to accept a first reference voltage, an input on line 208 to accept a second reference voltage, and an input on line 210 to accept a clock signal. The switched capacitor circuit 202 has an output connected to a signal ground on line 212, and a signal output on line 214 to supply a current impulse in response to the inputs.

A first type II current conveyor (CCII) 216 has an x terminal connected to line 214 to accept the current impulse, a y terminal connected to a signal ground on line 218, and a z terminal to supply an analog current on line 220 responsive to the current impulse. A sign (i.e., + or −) following the term "CCII" indicates the output current direction. Some examples of a CCII− are provided below. However, the CI DAC can also be enabled with a CCII+. Typically, the signal grounds for the switched capacitor circuit 202 and CCII 216 are the same, but they need not be so. In one aspect, the signals grounds on lines 212 and 218 are ground, as well as the second reference voltage on line 208. In another aspect, the second reference voltage is a negative voltage.

FIGS. 3A through 3E depict some exemplary switched capacitor circuits (prior art). The switched capacitor circuit 202 of FIG. 3A comprises a capacitor 300 having a first terminal on line 302, and a second terminal connected to the signal ground on line 212. A first switch 304 has a first input selectively connected to the first reference voltage on line 206, a second input selectively connected to the second reference voltage on line 208, a control input to accept the digital data bit on line 204, and an output connected to the capacitor first terminal on line 302 to supply a reference voltage selected in response to the digital data bit. A second switch 306 has a clock signal input to accept the clock signal on line 210, an input connected to the capacitor first terminal on line 302, and the signal output that is selectively connected to the capacitor first terminal in response to the clock signal, to supply the current impulse on line 214.

The switched capacitor circuit of FIG. 3B is a slight variation of the circuit of FIG. 3A, where the first switch 304 is enabled with either the digital data bit or its complement. In FIG. 3C a series capacitor 308 has a first terminal connected to signal ground on line 212a (Vb1) during a first phase of the clock when the current impulse is supplied to the CCII, and a second terminal that is connected to signal ground on line 212b (Vb2) during the second phase of the clock. The circuit of FIG. 3D is similar to the circuit of FIG. 3C, except that both terminals of capacitor 308 are connected to signal ground during the second clock phase. In FIG. 3E switch control logic 310 accepts two data bits and is enabled at the second phase of the clock. In this aspect the first switch is able to selectively connect to four possible reference voltages: V1, V2, V3, and V4, in response to control signals d1, d2, d3, and d4, respectively. Many other types of switch capacitor circuits are known in the art that would likewise enable the CI DAC of FIG. 2.

FIGS. 4A and 4B are schematic drawings depicting exemplary CCII-circuits (prior art). Generally, a current conveyor 216 is an abstraction for a three terminal electronic device in the form of an amplifier with unity gain. An ideal CCII can be seen as an ideal transistor, with perfected characteristics. No current flows into the gate or base, which is represented by y. There is no base-emitter or gate-source voltage drop, so the emitter or source voltage (at x) follows the voltage at y. The gate or base has an infinite input impedance (y), while the emitter or source has a zero input impedance (x). Any current out of the emitter or source (x) is reflected at the collector or drain (z) as a current in, but with an infinite output impedance.

In FIG. 4A a field effect transistor (FET) 400 has a gate connected to a bias voltage (Vb) on line 402, a source connected to the signal output of the first switched capacitor circuit on line 214, and a drain to supply the analog current on line 220. A current source 404 has a first terminal connected to the FET source on line 214 and a second terminal connected to the signal ground on line 218.

In FIG. 4B a bipolar junction transistor (BJT) 406 has a base connected to a bias voltage (Vb) on line 408, an emitter connected to the signal output of the first switched capacitor circuit on line 214, and a collector to supply the analog current on line 220. A current source 404 has a first terminal connected to the BJT emitter on line 214 and a second terminal connected to the signal ground on line 218. Addition details of the CI DAC can be found in the patent entitled, CURRENT IMPULSE (CI) DIGITAL-TO-ANALOG CONVERTER (DAC), invented by Mikko Waltari, Ser. No. 14/750,203, filed Jun. 25, 2015, and issued as U.S. Pat. No. 9,178,528 on Nov. 3, 2015, which is incorporated herein by reference.

FIG. 5 is a schematic diagram depicting the output bandwidth of CMOS circuitry (prior art). At the time of this writing, 14 nanometer (nm) CMOS is the state of the art, and the routing metals are optimized for dense co-located digital logic gates. The gate density is expected to increase as CMOS fabrication processes evolve. High current analog signals see a finite RC-limited bandwidth in traversing to the integrated circuit (IC) external package interface (bump) from the FinFet transistor source/drain (S/D), making the effective input bandwidth limited to less than 20 gigahertz (GHz), barring inductive bandpass coupling. Thus, even if sampled at a rate high enough to satisfy the Nyquist criteria, the use of conventional CMOS circuitry limits a CMOS ADC to output frequencies of less than 20 GHz.

Potential solutions to this problem are the addition of buffers between the IC package interface and the FinFet transistors. However, the use of buffers would contribute noise, distortion, and significant power usage, while only pushing the problem to the input of the buffer. Another solution is to use better (e.g., lower impedance) metal routing. However, the problem would remain in the via stack used to transition between IC metal stacks (typically 10 or more) to access the S/D. The via stack is comprised of multiple "thin metals", which have a relatively high impedance, and are adequate only for digital routing. Since a large percentage of the DAC functions are performed in the digital domain, it would be undesirable to design an IC with via thicknesses sufficient to support high frequency analog signals. Further, economics dictate that these thin metal vias will continue to get thinner to support higher density logic.

Another potential solution is to offload the sampling to better suited technology. For example, IBM's 9HP process uses thick metals and silicon/germanium (SiGe) transistors with a high frequency cutoff frequency of greater than 400 GHz. However, using thicker metals and SiGe transistors to enable collocated logic circuitry would make for large, power demanding ICs at an impractical price.

It would be advantageous if a DAC could be fabricated with SiGe transistors for the processing of high frequency analog signals, in combination with CMOS logic circuits, to reduce circuit size, power consumption, and cost.

It would be advantageous if analog signal images in higher order Nyquist zones could be generated from lower bandwidth digital data and used in wideband communications.

[1] A. Balteanu, et. al., "A 6-bit Segmented RZ DAC Architecture with up to 50-GHz Sampling Clock and 4 $V_{pp}$ Differential Swing", *IEEE Int. Microwave Symp.* (IMS), 2012 IEEE.

[2] H. Huang, et. al, "An 8-bit 100-GS/s Distributed DAC in 28-nm CMOS for Optical Communications", *IEEE Transactions on Microwave Theory and Techniques*, vol. 63, no. 4, pp. 1211-1218, April 2015.

SUMMARY OF THE INVENTION

Disclosed herein are a multi-zone digital-to-analog converter (DAC) system and method. The system uses track-and-hold (T/H) stages and current impulse DACs fabricated in a high frequency (e.g., IBM 9HP) technology, in combination with logic circuitry fabricated in a lower frequency capable (e.g., CMOS) technology. The two technologies, fabricated on separate dies, can then be integrated in a system-in-package solution where intermediate signals are transferred between each die.

Accordingly, a multi-zone digital-to-analog device is provided with a digital-to-analog (D/A) stage having an input to accept a digital input signal with a data bandwidth of M Hertz (Hz), a clock input to accept a clock signal with a clock frequency of P Hz, and an output to supply an analog value having a bandwidth of M Hz. An upsampling stage has an input to accept the analog value and a clock input to accept the clock signal. The upsampling stage has a device bandwidth of L Hz to supply an analog output signal with a full power bandwidth of K Hz, where (P/2)=M and M<K<L.

Alternatively stated, the upsampling stage supplies analog output signal images in a plurality of Nyquist zones. In one aspect, the D/A stage supplies N deinterleaved analog values having a combined bandwidth of M Hz, where N×(P/2)=M. For example, L may be at least 105 gigahertz (GHz) and M is 35 GHz, with the upsampling stage being fabricated with the use of silicon/germanium (SiGe) transistors, and the D/A stage being fabricated with CMOS transistors.

In one aspect, the D/A stage further includes N packaging interfaces respectively connecting the analog values from the D/A stage output to the upsampling stage input. Each packaging interface has a bandwidth of less than M Hz, and often a bandwidth of less than P Hz. More explicitly, the D/A stage includes a deinterleaver having a signal input to accept the digital input signal, a clock input to accept the clock signal, and an output to supply N deinterleaved digital values. Also included is a bank of N DACs, each DAC having a signal input to accept a corresponding deinterleaved digital value, a clock input, and a signal output to supply a corresponding analog value.

The upsampling stage includes a bank of N first sample-and-hold (S/H) circuits. Each first S/H circuit has an input to accept a corresponding analog value, a control port to accept the clock signal, and an output to supply a corresponding sampled analog value. A delay-locked loop has an input to accept the clock signal and an output to supply the N phases of the clock frequency. A bank of N current impulse (CI) DACs are included, each CI DAC having an input to accept a corresponding sampled analog value, a control port to accept the clock signal, and an output to supply a corresponding impulse signal. Further provided is a bank of N second S/H circuits. Each second S/H circuit has an input to accept a corresponding impulse signal, a control port to accept a corresponding clock phase, and an output to supply a corresponding sampled impulse signal. An interleaver has an input to accept the N sampled impulse signals and an output to supply the analog output signal. In one aspect, the D/A stage DACs are zero-order hold DACs supplying analog values having a pulse width duration of 1/P, and the CI DACs supply impulse signals having a root mean square (RMS) pulse width duration of less than or equal to 1/(N×P).

In a transmitter, the multi-zone digital-to-analog device may further include a bandpass selectable filter having an input to accept the analog output signal and an output to supply a bandpass-filtered analog output signal in a predetermined Nyquist zone. The multi-zone transmitter may further include a power amplifier having a signal input to accept the filtered signal and an output to supply an amplified signal. An antenna has an input to accept the amplified signal and a radiator to supply a wireless signal. In addition to the multi-zone transmitter, a transceiver variation includes a transmit/receive (T/R) switch having an antenna port connected to the antenna input, an input connected to the power amplifier output, a receiver port, and a multi-zone receiver connected to the receiver port.

Additional details of the above-described multi-zone DAC, a transmitter made using the multi-zone DAC, a multi-zone DAC conversion method, and a multi-zone transceiver are provided below.

DETAILED DESCRIPTION

Figure 6:
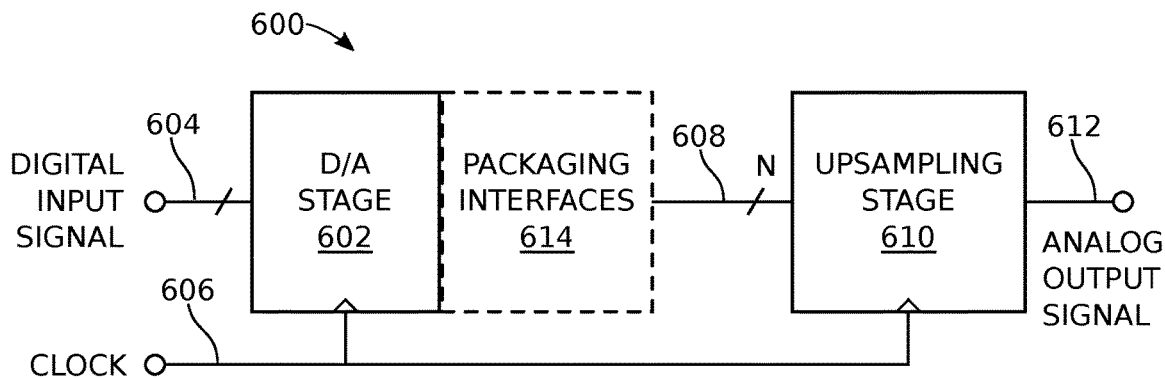
FIG. 6 is a schematic block diagram of an exemplary multi-zone digital-to-analog device.
Figure 3B:
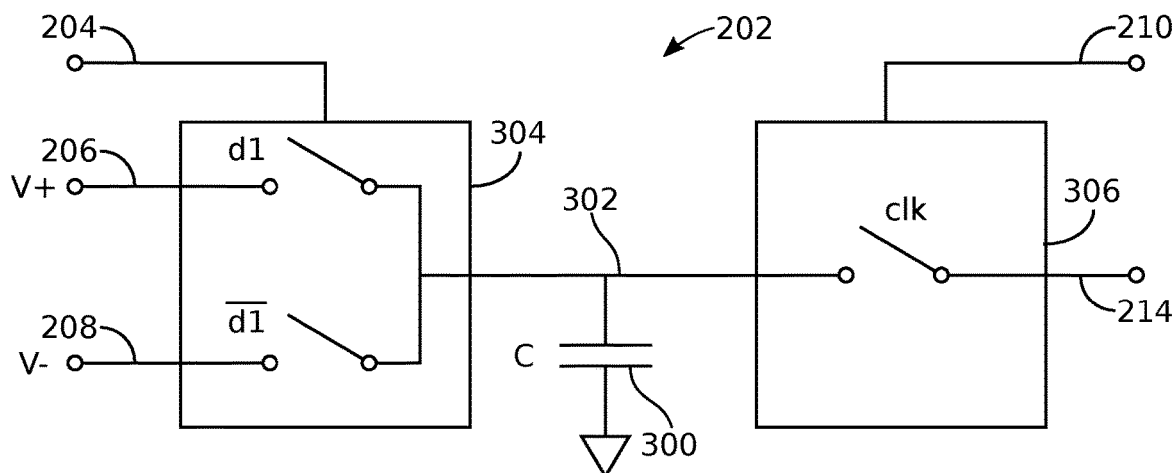
Figure 3C:
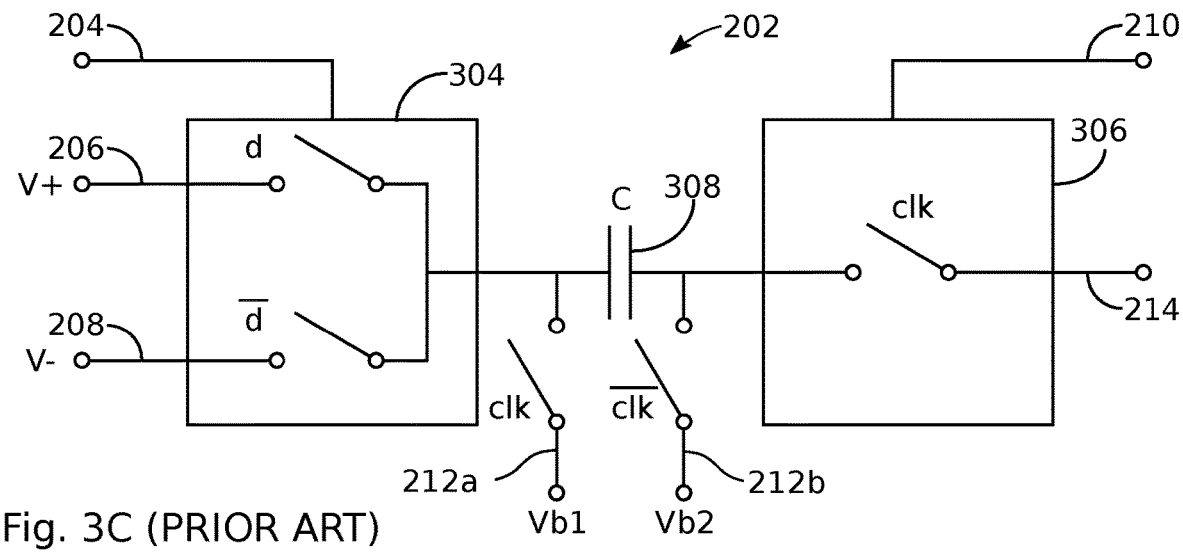
Figure 3D:
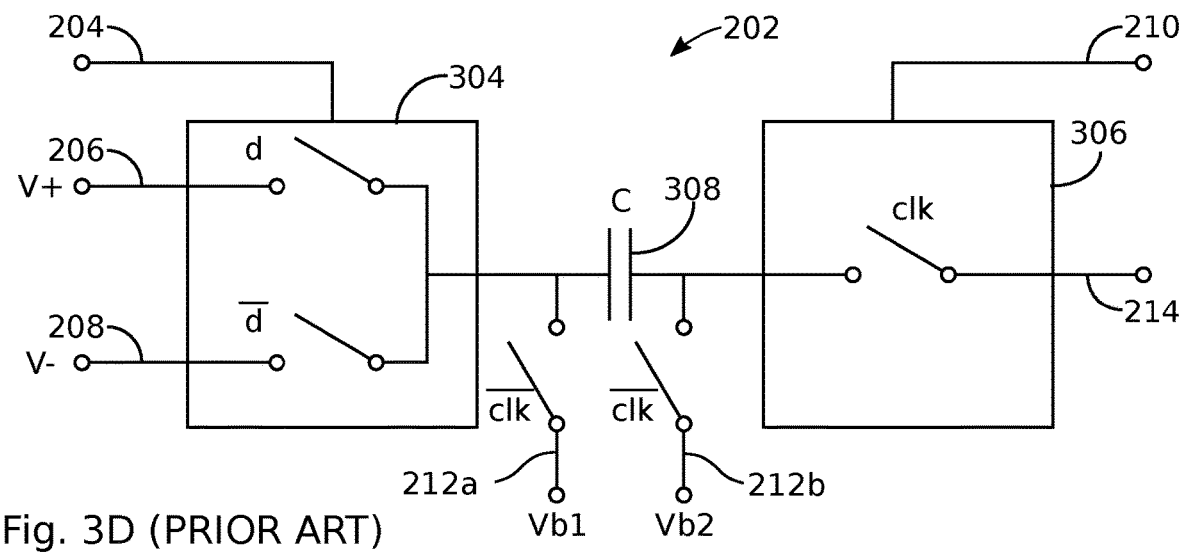
Figure 3E:
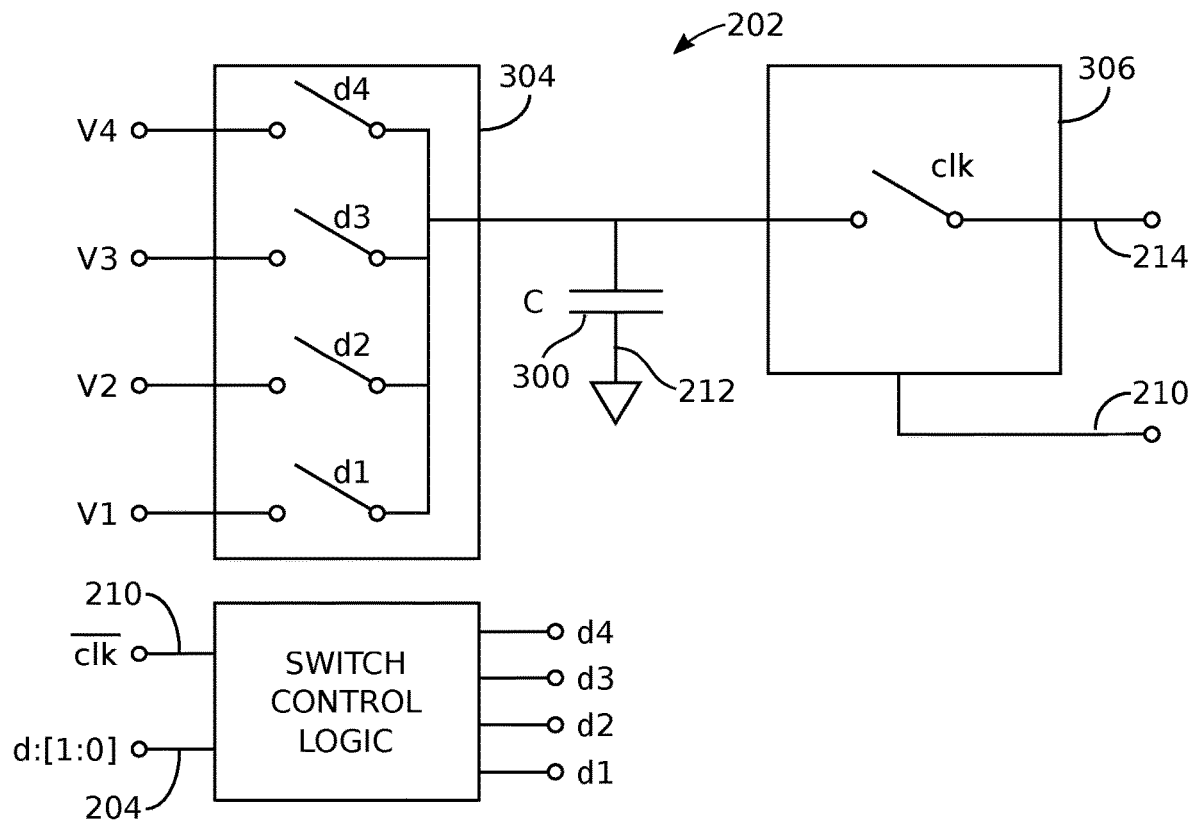
Figure 4A:
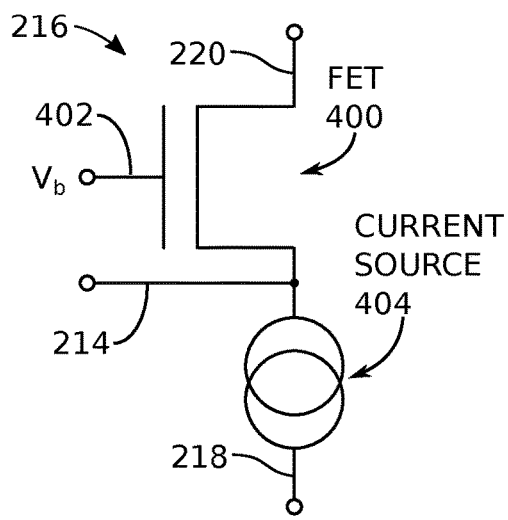
FIGS. 4A and 4B are schematic drawings depicting exemplary CCII-circuits (prior art).
Figure 4B:
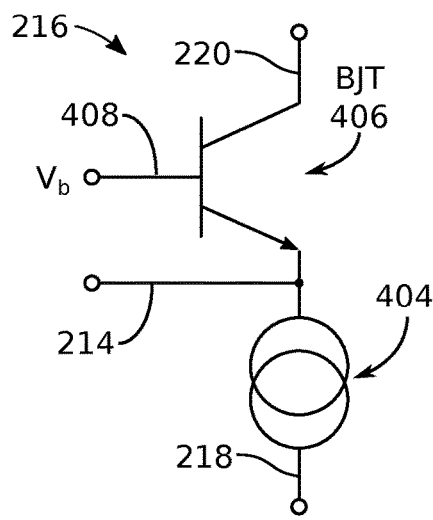

FIG. 6 is a schematic block diagram of an exemplary multi-zone digital-to-analog device. The multi-zone device 600 comprises a digital-to-analog (D/A) stage 602 having an input on line 604 to accept a digital input signal with a data bandwidth of M Hertz (Hz). A clock input on line 606 accepts a clock signal with a clock frequency of P Hz, and an output on line 608 supplies an analog value having a bandwidth of M Hz. An upsampling stage 610 having an input on line 608 to accept the analog value and a clock input on line 606 accepts the clock signal. The upsampling stage 610 has a device bandwidth of L Hz, meaning that essential active devices have the ability to operate with a bandwidth of L Hz regardless of the bandwidth of the analog output signals actually supplied. The upsampling stage 610 supplies an analog output signal with a full power bandwidth of K Hz on line 612, where (P/2)=M and M<K<L. In one aspect, the D/A stage 602 supplies N deinterleaved analog values on line 608 having a combined bandwidth of M Hz, where N×(P/2)=M. N can be any integer value greater than 1. In one aspect, M is defined as a 3 dB bandwidth, although other definitions of bandwidth are known in the art that would be applicable.

In one aspect, L is at least 105 gigahertz (GHz) and M is 35 GHz. Thus, the upsampling stage 610 is fabricated with transistors (e.g., silicon/germanium (SiGe) transistors) having a cutoff frequency of greater than L Hz, and the D/A stage 602 is fabricated with transistors (e.g., CMOS transistors) having a cutoff frequency greater than M Hz and less than L Hz.

In another aspect, the D/A stage 602 may further comprise N packaging interfaces 614 (shown in phantom) respectively connecting the analog values from the D/A stage output on line 608 to the upsampling stage input. Each packaging interface has a bandwidth of less than M Hz, and often a bandwidth of less P Hz, see the explanation of FIG. 5 above. If realized in CMOS, at the time of this writing the maximum frequency of each clock phase delivered to a CMOS circuit cannot be much greater than 17.5 GHz. Thus, the bandwidth limitations associated with the provision of signals from the CMOS source/drains likewise applies to the clock signals provided to CMOS transistor gates. As a result, the DAC circuits cannot practically, without violating Nyquist considerations, provide interleaved analog signals having a bandwidth much greater than about 8.75 GHz.

Figure 5:
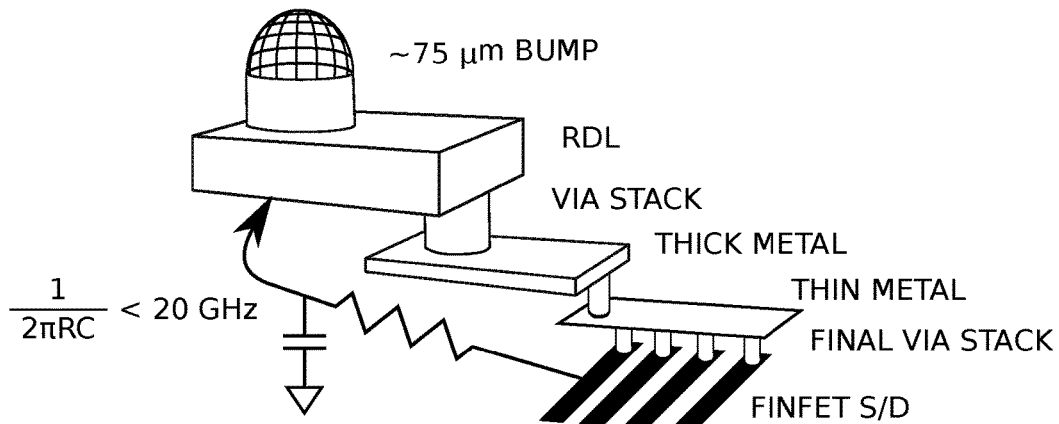
FIG. 5 is a schematic diagram depicting the output bandwidth of CMOS circuitry (prior art).

It is impractical to move a signal at a high enough bandwidth in a CMOS die due to the limitations in metallization, as mention above in the description of FIG. 5. So, the signal transfer may be made efficiently from a D/A stage CMOS die to an upsampling stage SiGe die at a relatively low bandwidth, and then the analog signal is "built" in the SiGe die. Note, it is also impractical to process the massive number of digital signals and complete the digital-to-analog conversion in the SiGe chip, as such circuitry would be relatively large in size and consume significant power. Thus, discrete analog charges are transferred from the CMOS domain to the SiGe domain, and the analog charge quantities are used to generate a continuous time signal. The continuous time signal is created with an "analog pulse shaper" or current impulse DAC, as described in detail below, by discharging the sample capacitors sequentially into the output stage.

As noted above, the D/A stage 602 and upsampling stage 610 may be fabricated using different technologies. Complex high-speed communication systems often rely upon devices and materials that require different substrates and different processing technologies. Conventionally, this has prevented the integration of these devices into a single fabrication process flow. Thus, integration of these device technologies has occurred only at the chip-to-chip level, which introduces significant bandwidth and latency-related performance limitations on these systems, as well as increased size, weight, power, and packaging/assembly costs as compared to microsystems fully integrated on a single chip.

The Diverse Accessible Heterogeneous Integration (DAHI) program has developed transistor-scale heterogeneous integration processes to intimately combine advanced compound semiconductor (CS) devices, as well as other emerging materials and devices, with high-density silicon complementary metal-oxide-semiconductor (CMOS) technology, so as to establish a manufacturable, accessible foundry technology for the monolithic heterogeneous co-integration of diverse devices and complex silicon-enabled architectures on a common substrate platform. Some of the microsystem devices and materials that may be integrated include:

Silicon complementary metal-oxide-semiconductor (Si CMOS) for highly integrated analog and digital circuits;

Gallium nitride (GaN) for high-power/high-voltage swing and low-noise amplifiers;

Gallium arsenide (GaAs) and indium phosphide (InP) heterojunction bipolar transistors (HBT) and high-electron mobility transistors (HEMT) for high speed/high-dynamic-range/low-noise circuits;

Antimonide-based compound semiconductors for high-speed, low-power electronics;

Compound semiconductor optoelectronic devices for direct-bandgap photonic sources and detectors, as well as or silicon-based structures for modulators, waveguides, etc.; and, Microelectromechanical (MEMS) components for sensors, actuators, and RF resonators.

Figure 7:
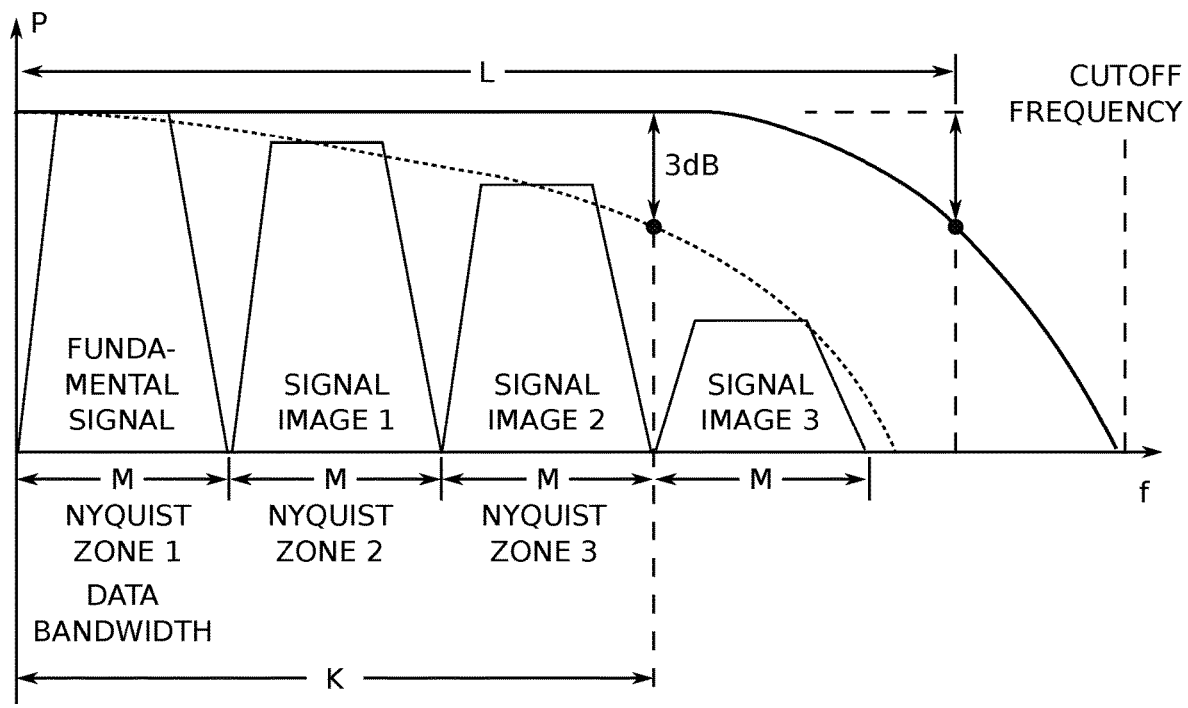
FIG. 7 is a diagram depicting the output spectrum of the multi-zone digital-to-analog device.

FIG. 7 is a diagram depicting the output spectrum of the multi-zone digital-to-analog device. As shown, the upsampling stage supplies analog output signal images in a plurality of Nyquist zones. The fundamental analog output signal (Nyquist zone 1), signal image 1 (Nyquist zone 2), and signal image 2 (Nyquist zone 3) are all located in the full power bandwidth K. Ideally, the signal images in the full power bandwidth have the same magnitude or power level. As shown, the full power bandwidth K is defined by a 3 dB bandwidth. Practically, some frequency related power roll-off occurs in the full power bandwidth due to sin(x)/x attenuation and the cutoff frequency of the transistors. Likewise, the L bandwidth is defined by its 3 dB bandwidth. However, other measures of bandwidth are well known in the art, and would also be applicable.

The Nyquist frequency is half of the sampling rate ($F_S$) of a discrete signal processing system, and the Nyquist rate is the minimum sampling rate that satisfies the Nyquist sampling criterion for a given signal. The Nyquist rate is twice the maximum component frequency of the function being sampled.

Figure 8:
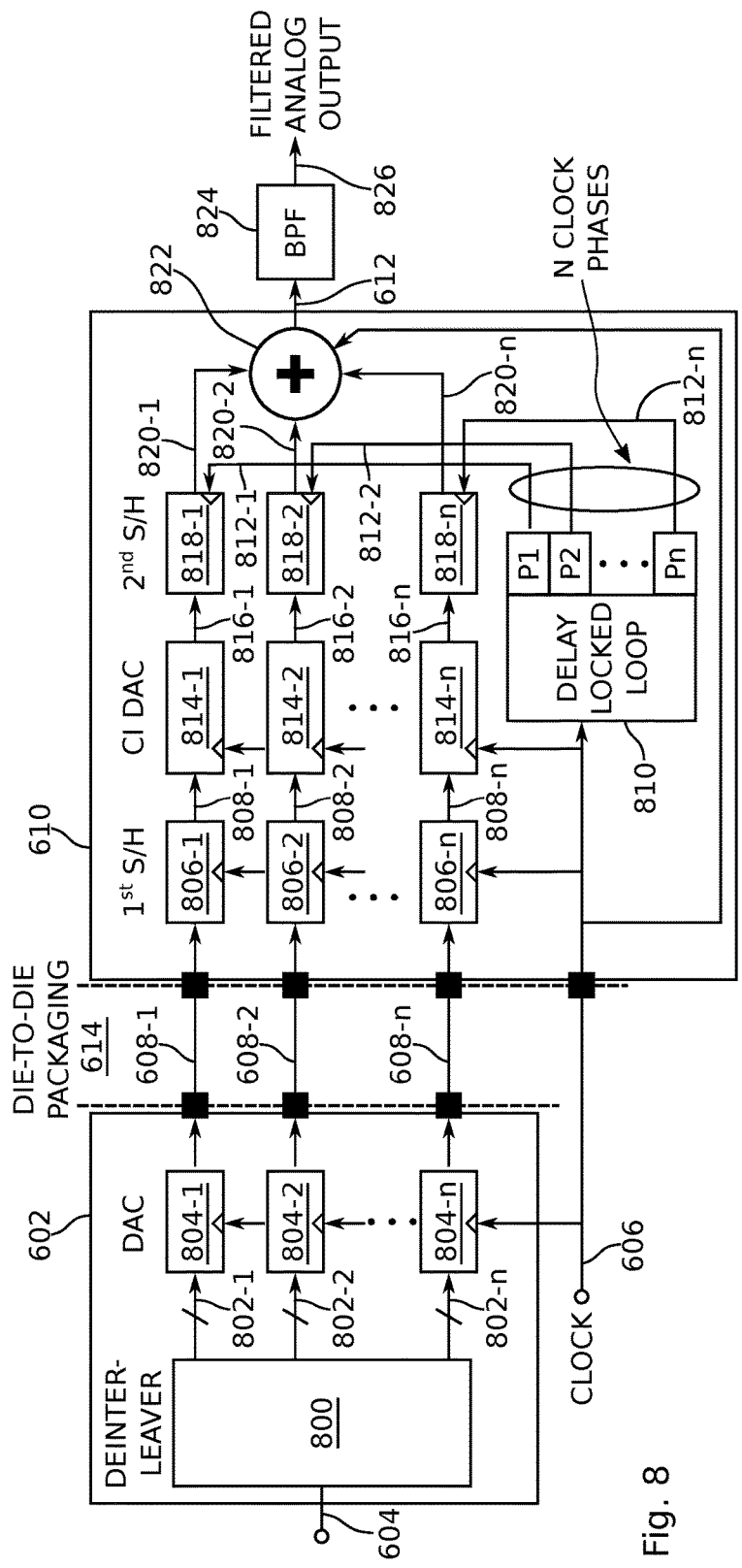
FIG. 8 is a schematic block diagram depicting the multi-zone digital-to-analog device of FIG. 6 in greater detail.

FIG. 8 is a schematic block diagram depicting the multi-zone digital-to-analog device of FIG. 6 in greater detail. The D/A stage 602 comprises a deinterleaver 800 having a signal input on line 604 to accept the digital input signal, a clock input on line 606 to accept the clock signal, and an output on lines 802-1 through 802-$n$ to supply N deinterleaved digital values. The D/A stage 602 also includes a bank of N digital-to-analog converters (DACs) 804-1 through 804-$n$. Each DAC has a signal input to accept a corresponding deinterleaved digital value, a clock input on line 606, and a signal output to supply a corresponding analog value on lines 608-1 through 608-$n$. The packing interfaces are depicted as reference designator 614.

The upsampling stage 610 comprises a bank of N first sample-and-hold (S/H) circuits 806-1 through 806-$n$. Each first S/H circuit has an input to accept a corresponding analog value from lines 608-1 through 608-$n$, a control port to accept the clock signal on line 606, and an output to supply a corresponding sampled analog value on lines 808-1 through 808-$n$. A delay-locked loop 810 has an input on line 606 to accept the clock signal, and an outputs on lines 812-1 through 812-$n$ to supply the N phases of the clock frequency. The upsampling stage also comprises a bank of N current impulse (CI) DACs 814-1 through 814-$n$, also known as analog pulse shapers. The CI DACs are presented as an exemplary means of creating impulse signals, but the system described herein may be enabled by other means of shaping analog pulses into impulse signals. Each CI DAC has an input to accept a corresponding sampled analog value on lines 808-1 through 808-$n$, a control port to accept the clock signal on line 606, and an output to supply a corresponding impulse signal on lines 816-1 through 816-$n$. The upsampling stage 610 further comprises a bank of N second S/H circuits 818-1 through 818-$n$, which may also be referred to as switches. Each second S/H circuit has an input to accept a corresponding impulse signal on lines 816-1 through 816-*n*, a control port to accept a corresponding clock phase on lines 812-1 through 812-*n*, and an output to supply a corresponding sampled impulse signal on lines 820-1 through 820-*n*. An interleaver 822 has an input to accept the N sampled impulse signals on lines 820-1 through 820-*n* and an output to supply the analog output signal on line 612.

In one aspect, the D/A stage DACs 804-1 through 804-*n* are zero-order hold DACs supplying analog values having a pulse width duration of 1/P. The CI DACs 814-1 through 814-*n* supply impulse signals having a root mean square (RMS) pulse width duration of less than or equal to 1/(N×P).

In another aspect, the multi-zone digital-to-analog device 600 is connected to a bandpass selectable filter (BPF) 824 having an input on line 612 to accept the analog output signal and an output on line 826 to supply a bandpass-filtered analog output signal in a predetermined Nyquist zone.

Figure 1A:
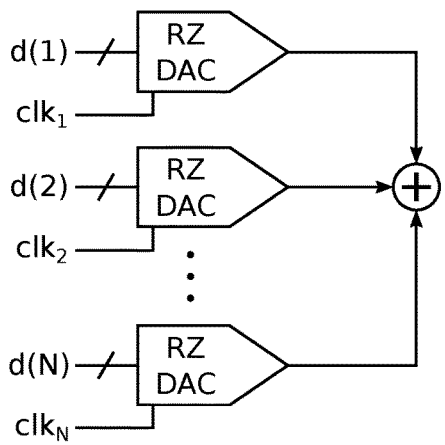
FIG. 1A is a schematic depicting the general concept of an interleaved DAC.
Figure 1B:
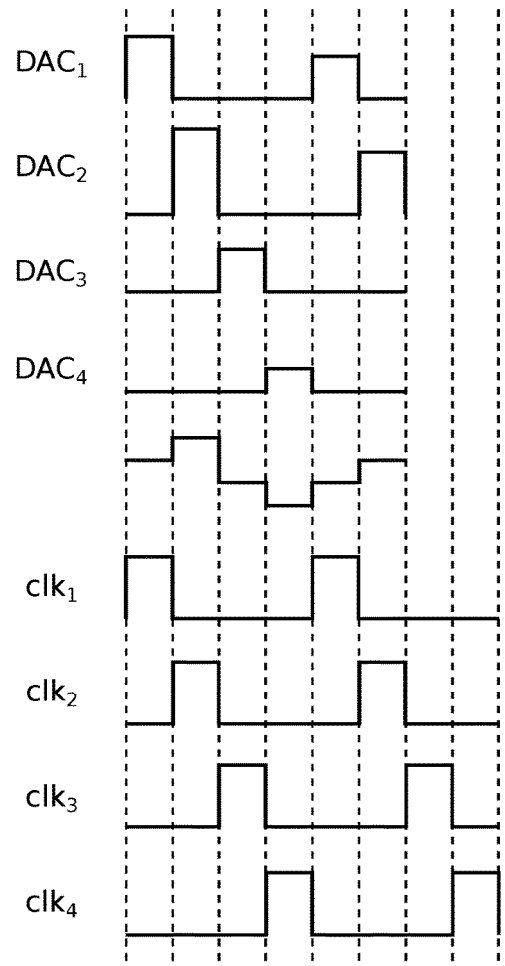
FIG. 1B depicts associated waveforms (prior art).
Figure 9:
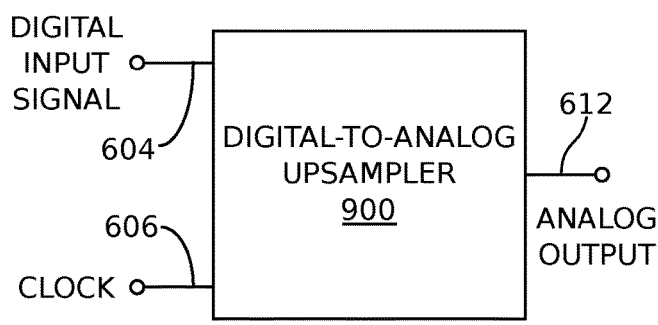
FIG. 9 is a schematic block diagram of a multi-zone digital-to-analog device where the digital-to-analog conversion is performed in the upsampling stage, without the requirement of the D/A stage.
Figure 3A:
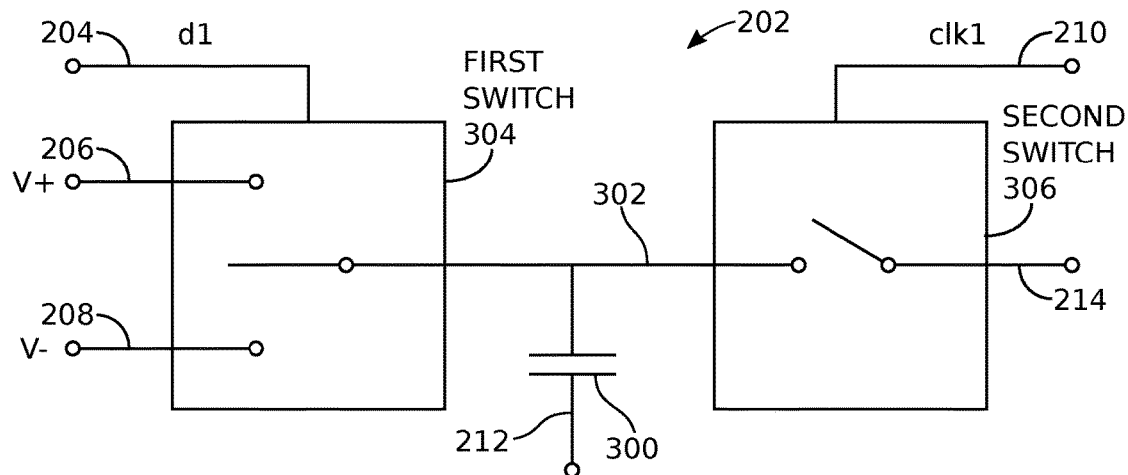
FIGS. 3A through 3E depict some exemplary switched capacitor circuits (prior art).
Figure 2:
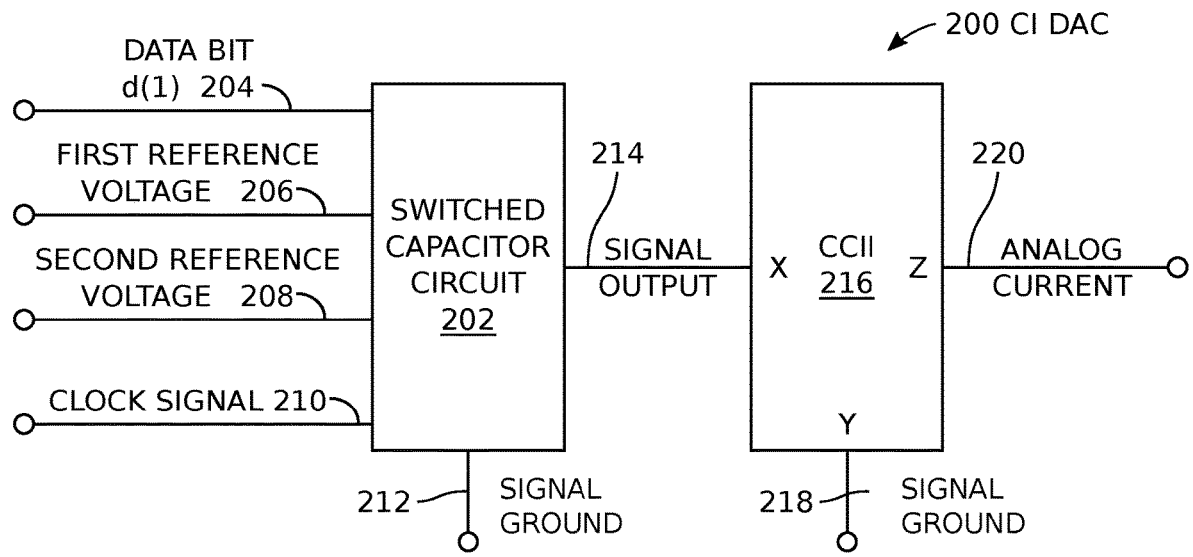
FIG. 2 is a schematic block diagram of a current impulse (CI) DAC (prior art).

FIG. 9 is a schematic block diagram of a multi-zone digital-to-analog device where the digital-to-analog conversion is performed in the upsampling stage, without the requirement of the D/A stage. The multi-zone digital-to-analog device 900 comprises an input on line 604 to accept a digital input signal having a data bandwidth of M Hz, a clock input on line 606 to accept a clock signal having a clock frequency of P Hz, and an output on line 612 with a device bandpass of L Hz to supply an analog output signal with a full power bandwidth of K Hz, where (P/2)=M and M<K<L. In one aspect (as shown), the input on line 604 accepts N deinterleaved digital input signals on lines 604-1 through 604-*n* having a combined bandwidth of M Hz, where N×(P/2)=M. As with the multi-zone digital-to-analog device of FIG. 6, the analog output signal includes signal images in a plurality of Nyquist zones.

Figure 10:
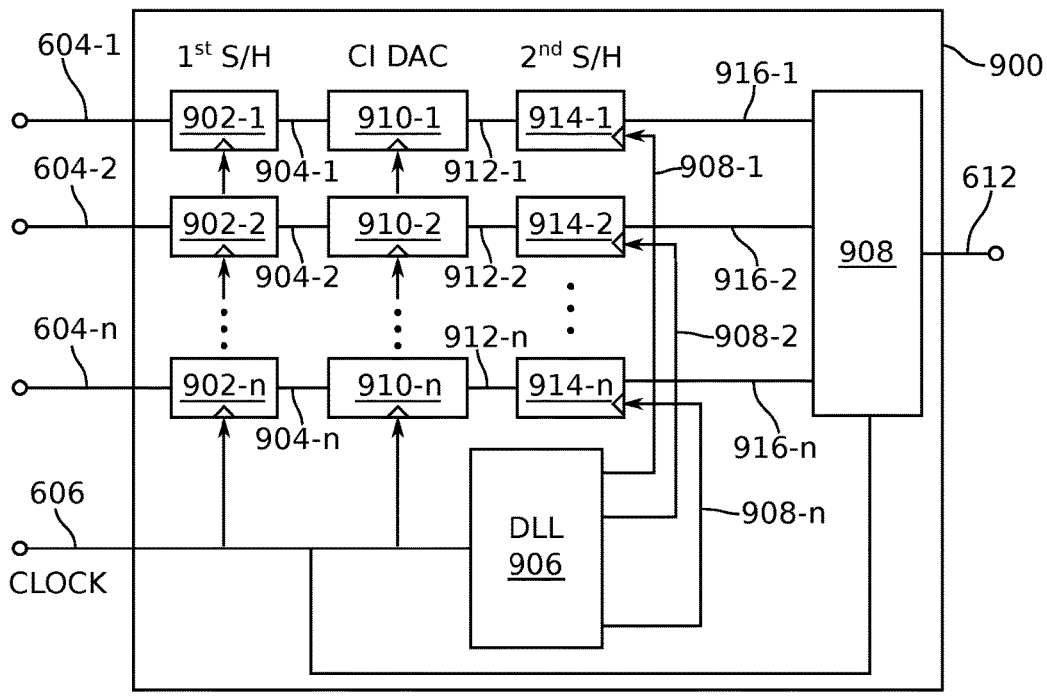
FIG. 10 is a schematic block diagram depicting the multi-zone digital-to-analog device of FIG. 9 in greater detail.

FIG. 10 is a schematic block diagram depicting the multi-zone digital-to-analog device of FIG. 9 in greater detail. The multi-zone digital-to-analog device 900 comprises a bank of N first (S/H circuits 902-1 through 902-*n*). Each first S/H circuit has a signal input to accept a corresponding deinterleaved digital value, a clock input on line 606, and a signal output to supply a corresponding sampled analog value on lines 904-1 through 904-*n*. A DLL 906 has an input on line 606 to accept the clock signal and an output on lines 908-1 through 908-*n* to supply N phases of the clock frequency. The multi-zone digital-to-analog device 900 comprises a bank of N CI DACs 910-1 through 910-*n*. Each CI DAC has an input to accept a corresponding sampled analog value on lines 904-1 through 904-*n*, a control port to accept the clock signal on line 606, and an output to supply a corresponding impulse signal on lines 912-1 through 912-*n*.

The multi-zone digital-to-analog device 900 further comprises a bank of N second S/H circuits 914-1 through 914-*n*. Each second S/H circuit has an input to accept a corresponding impulse signal on lines 912-1 through 912-*n*, a control port to accept a corresponding clock phase on lines 908-1 through 908-*n*, and an output to supply a corresponding sampled impulse signal on lines 916-1 through 916-*n*. An interleaver 918 has an input to accept the N sampled impulse signals on lines 916-1 through 916-*n*, and an output to supply the analog output signal on line 612. In one aspect, the CI DACs 910-1 through 910-*n* supply impulse signals having a RMS pulse width duration of less than or equal to 1/(N×P). Although not explicitly shown, a selectable bandpass may be incorporated either internally or externally to the multi-zone digital-to-analog device to controllably filter the analog output signal on line 612.

Figure 11:
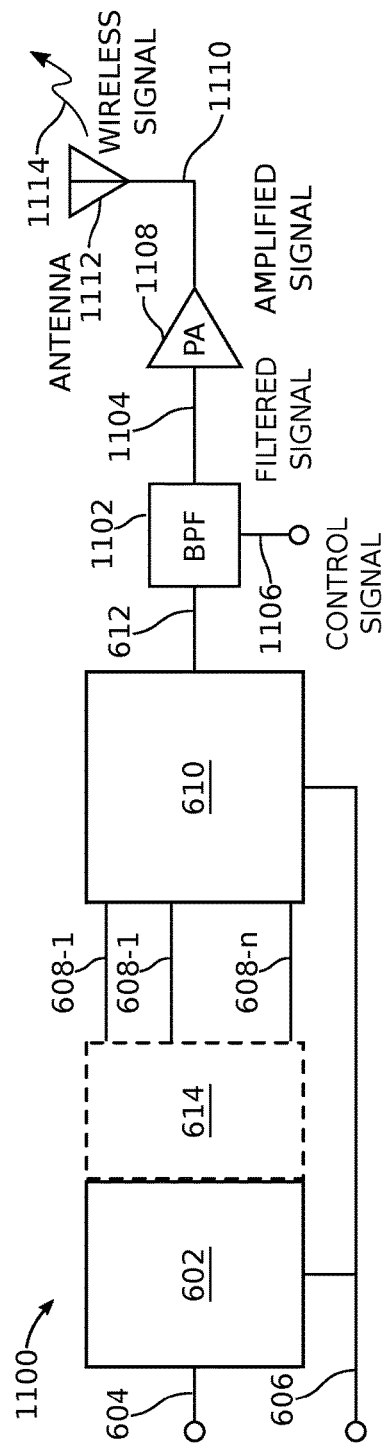
FIG. 11 is a schematic block diagram depicting a multi-zone transmitter.

FIG. 11 is a schematic block diagram depicting a multi-zone transmitter. The transmitter 1100 comprises a digital-to-analog (D/A) stage 602 an upsampling stage 610. The D/A stage 602 and upsampling stage 610 have been explained above in the descriptions of FIGS. 6 and 8, and in the interest of brevity the descriptions are repeated here. In some aspects, the packaging interface is a consideration, and it is shown in phantom. Alternatively but not shown, the transmitter may be enabled using the multi-zone digital-to-analog device of FIGS. 9 and 10.

The transmitter 1100 further comprises a bandpass filter (BPF) 1102 having an input to accept the analog output signal on line 612, and an output on line 1104 to supply a filtered signal with a bandwidth of M Hz in a predetermined Nyquist zone. However, the filter bandwidth need not necessarily precisely match the bandwidth of the signal images. In one aspect, the bandpass filter 1102 has an adjustable bandpass output and a control input on line 1106 to accept a control signal for selecting the bandpass filter center frequency. A power amplifier (PA) 1108 has a signal input on line 1104 to accept the filtered signal and an output on line 1110 to supply an amplified signal. An antenna 1112 has an input to accept the amplified signal on line 1110 and a radiator to supply a wireless signal represented by reference designator 1114.

Figure 12:
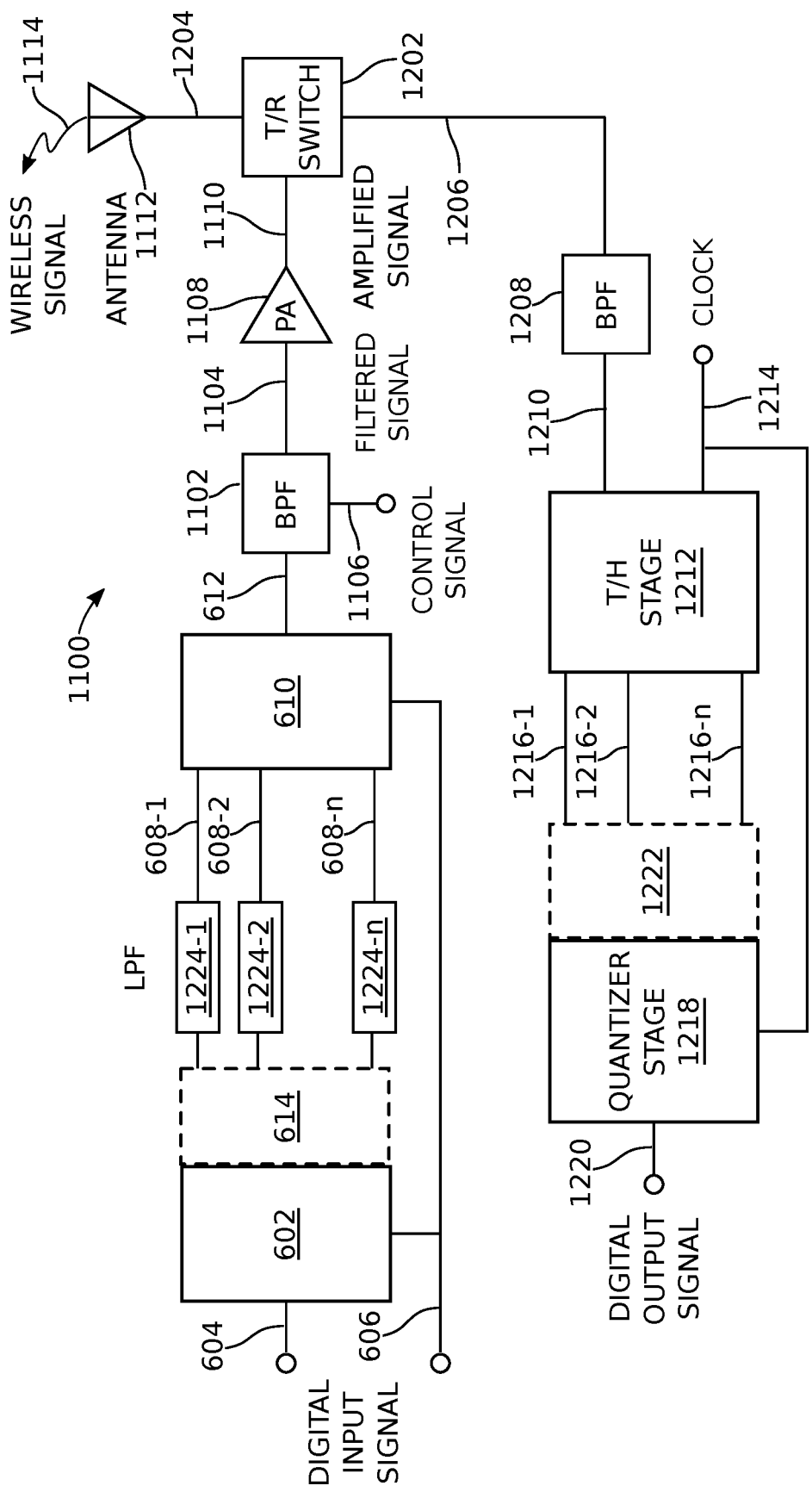
FIG. 12 is a schematic block diagram of a multi-zone transceiver.

FIG. 12 is a schematic block diagram of a multi-zone transceiver. The transceiver 1200 includes the transmitter components described above in the explanation of FIG. 11. The transceiver also comprises a transmit/receive (T/R) switch 1202 having an antenna port connected to the antenna input on line 1204, an input connected to the power amplifier output on line 1110, and a receiver port on line 1206. A multi-zone receiver comprises a bandpass filter 1208 having an input connected to the T/R switch receiver port on line 1206, to accept an analog signal having a center frequency less than or equal to L Hz, and a signal output on line 1210 to supply a filtered signal having a bandwidth of at least Z Hz. A T/H stage 1212 has a signal input with a bandwidth of at least L Hz to accept the filtered signal on line 1210, a clock input on line 1214 to accept a clock signal with a clock frequency of S Hz, and R deinterleaved signal outputs on lines 1216-1 through 1216-*n* with a combined bandwidth of Z Hz, where R×(S/2)=Z, L>Q×Z, and Q is an integer greater than 1. In one aspect, Z=M, R=N, and S=P.

A quantizer stage 1218 has R interleaved signal inputs connected to corresponding T/H stage signal outputs on lines 1216-1 through 1216-*n*, a clock input on line 1214 to accept the clock signal, and an output on line 1220 to supply a digital output signal having a bandwidth of Z Hz. As shown in phantom, the quantizer stage 1218 has a packaging interface 1222 similar to packaging interface 614.

Optionally, low pass filters (LPFs) 1224-1 through 1224-*n* may be interposed between the D/A stage 602 and upsampling stage 610. The LPFs have a cutoff of Z Hz and improve the analog signal transfer from 610 to 614 by relaxing the requirement on the sampling signal phase. In the absence of the filters, the signals need to be sampled at the precise phase for complete analog settling. However, the settling can be non-linear with some slewing behavior, which complicates the phase calibration. When filtered, the signal images on lines 608-1 through 608-*n* can be sampled at any clock phase without loss of signal. These filters may be referred to as reconstruction filters since they allow a sample-and-held signal to be reconstructed into a band limited analog signal. As an analog signal, it can be sampled again at any rate without a loss of information, so that the sampling phase is theoretically irrelevant. Additional details of the multi-zone receiver can be found in the application entitled, MULTI-ZONE ANALOG-TO-DIGITAL CONVERTER (ADC), invented by Mike Kappes, Ser. No. 15/673,228, filed Aug. 9, 2017.

Figure 13A:
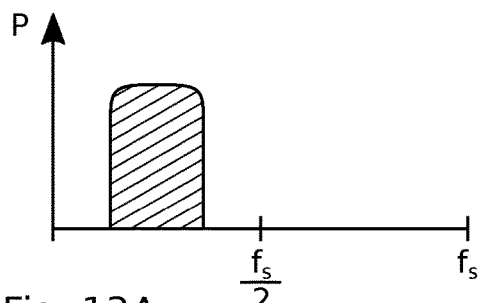
FIGS. 13A through 13C depict an exemplary transmitter output spectrum.
Figure 13B:
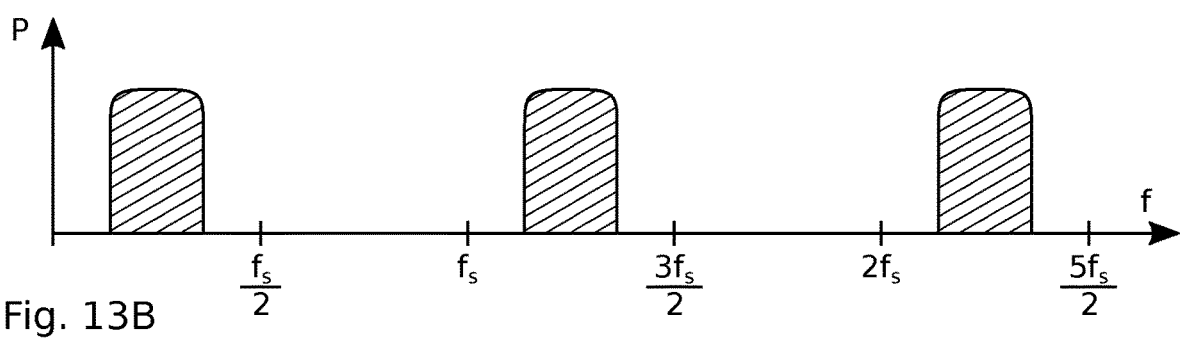
Figure 13C:
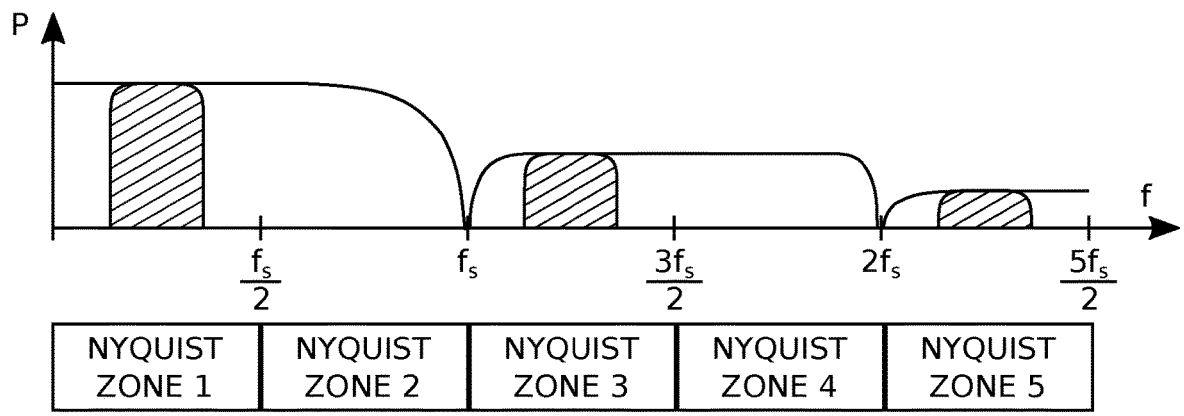

FIGS. 13A through 13C depict an exemplary transmitter output spectrum. In FIG. 13A a digital domain signal has a data bandwidth of less than Fs/2, with an amplitude and bandwidth normalized to a sample rate (Fs) of 1. After conversion to an analog signal (FIG. 13B), the signal is replicated indefinitely in each Nyquist zone. However, this assumes the signal is represented at each time step by an impulse with infinite amplitude, which is not conventionally practical. More conventionally (FIG. 13C), the digital signal can approximated by a zero-order hold function that imposes a sin(x)/x attenuation on the converted analog signal. Note the signal attenuation at higher Nyquist zones due to the sin(x)/x impact of the zero order hold. For example, to transmit a maximum output signal in Nyquist zone 5, the output bandwidth of the transmitter must exceed 5Fs/2 so that the signal is not attenuated any further.

Figure 14A:
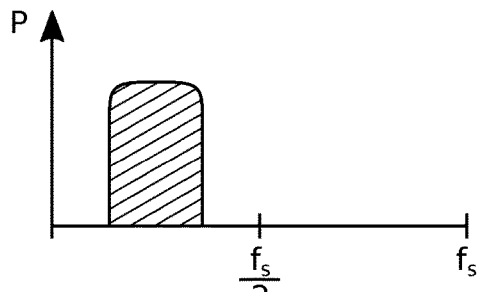
FIGS. 14A through 14C depict an exemplary interleaved transmitter output spectrum.
Figure 14B:
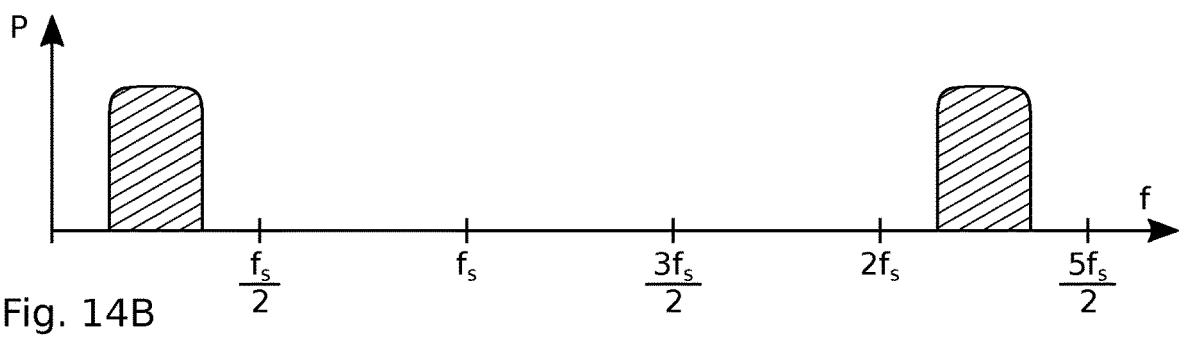
Figure 14C:
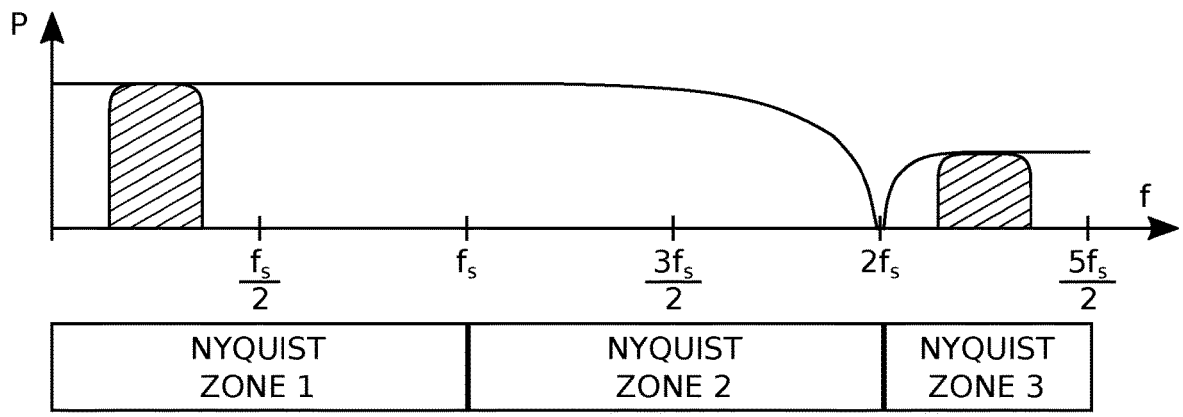

FIGS. 14A through 14C depict an exemplary interleaved transmitter output spectrum. Using the same data bandwidth as in FIGS. 13A-13C, interleaving effectively extends the sample rate from Fs to 2Fs, assuming an interleaving factor of 2× (FIG. 14A). After conversion, the analog signal is replicated indefinitely in each Nyquist zone, again assuming that the digital signal is represented at each time step by an impulse with infinite amplitude. Interleaving drops the unused signal image that occurred in Nyquist zone 3 of FIG. 13B. FIG. 14C assumes digital signals approximated by a zero-order hold function that result in some degree of sin(x)/x attenuation. However, compared to FIG. 13C, the attenuation is less. Note that interleaving also permits the data bandwidth to be doubled, if desired. As described above, the use of impulse pulses in the upsampling stage addresses the issue of sin(x)/x attenuation.

Figure 15:
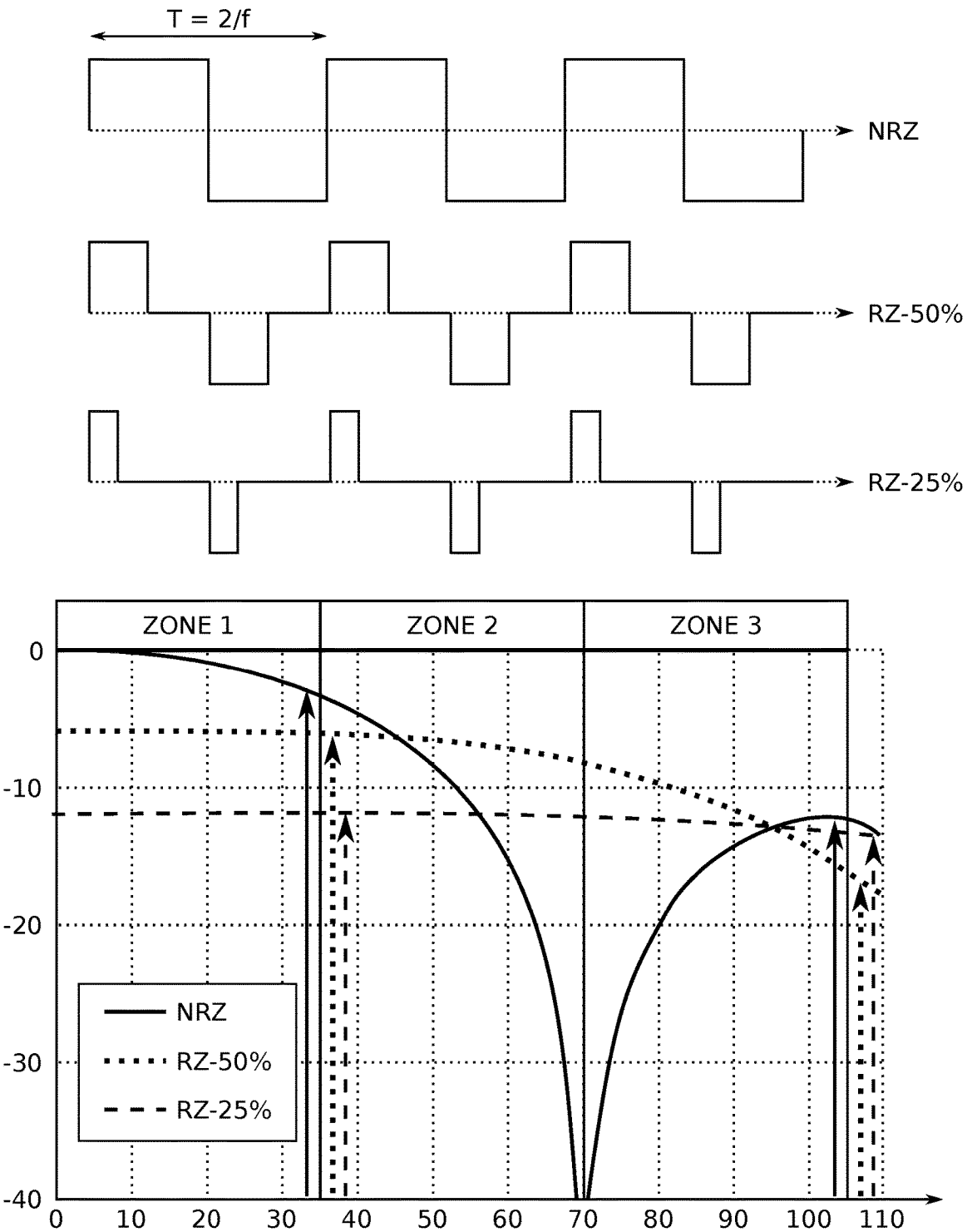
FIG. 15 is a diagram depicting various DAC pulse shapes and their representation in the frequency domain.

FIG. 15 is a diagram depicting the relationship between DAC pulse shapes and their representation in the frequency domain. For a typical NRZ (non-return-to-zero) DAC, operating at 70 gigasamples per second (Gsps) for example, generating its zero-order hold pulse shape at a maximum output rate with alternating+/−maximum signals, the output is a simple square wave at a frequency of Fs/2 (35 GHz). The frequency domain is represented by the solid arrows recurring at odd multiples of the sample rate since the Fourier transfer function of a square wave is a sin(x)/x function.

The return-to-zero (RZ) pulse at 50% is narrower than the NRZ pulse and approximates an effective sample rate at 2Fs. However, for the same pulse amplitude there is less power since the pulse is half the width (dotted line). If an RZ pulse with a 25% pulse width is used, a wide flat bandwidth results, but with a loss of 12 dB of power (dashed line) in the second Nyquist zone. Note that the power of the third Nyquist zone image is slightly higher than that of the RZ 50% pulse width. Both RZ and NRZ DACs are zero-order hold. The NRZ just does not exhibit a return to zero pulse, it just moves from level to level with an ideal staircase function. A first-order hold would exhibit a linear ramp from level to level.

If the RZ 25% pulse width pulses are interleaved with multiple DACs, the power can recovered while simultaneously increasing the usable bandwidth. Thus, it is advantageous to interleave as much as possible, using higher Nyquist zones signal images for the output.

Figure 16:
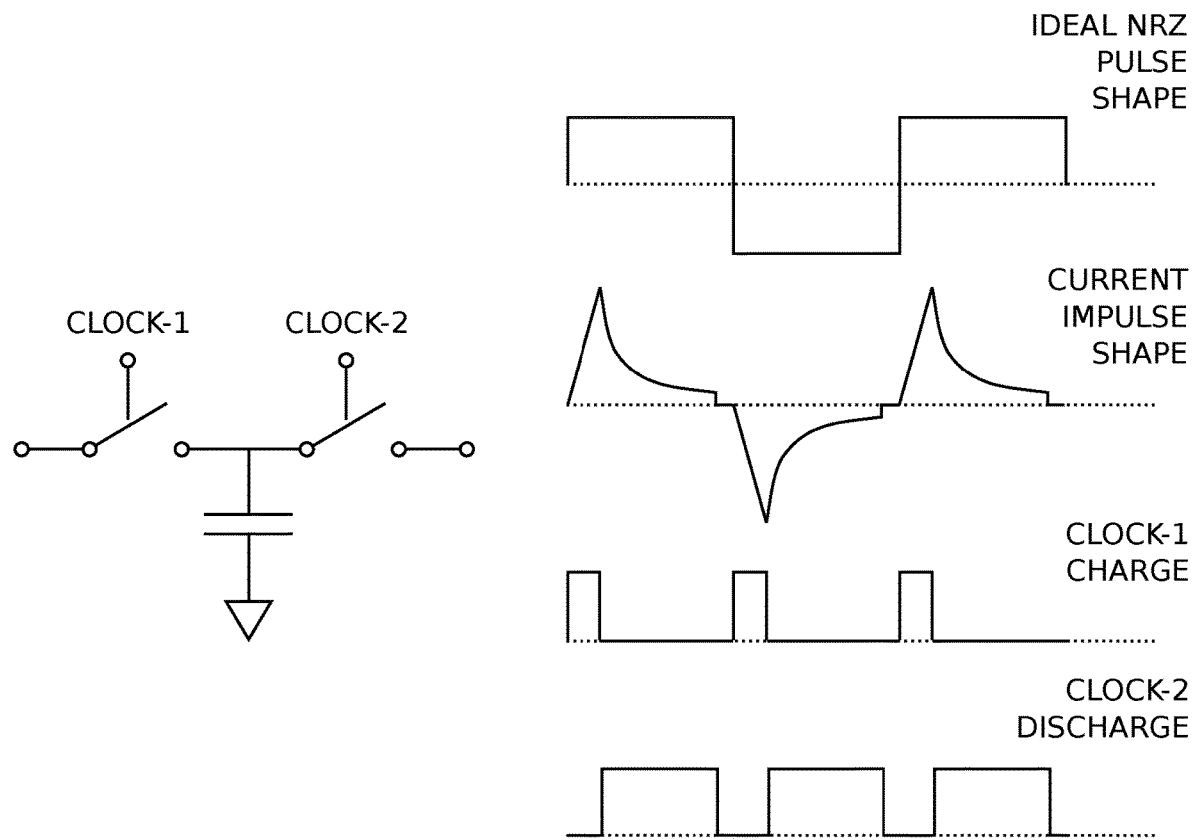
FIG. 16 depicts the relationship between an exemplary DAC pulse shape and its corresponding current impulse shape.

FIG. 16 depicts the relationship between an exemplary NRZ DAC pulse shape and its corresponding current impulse shape. FIG. 16 shows an ideal NRZ pulse shape, and a current impulse shape from a switch-capacitor current generator, such as the CI DACs described above. Assuming the impulse function has an approximate 25% pulse width, the converted analog signals in the third Nyquist zone are nearly flat (lossless). The figure depicts the correspondence between the impulse pulse shape and current generator capacitor charging/discharging.

Figure 17:
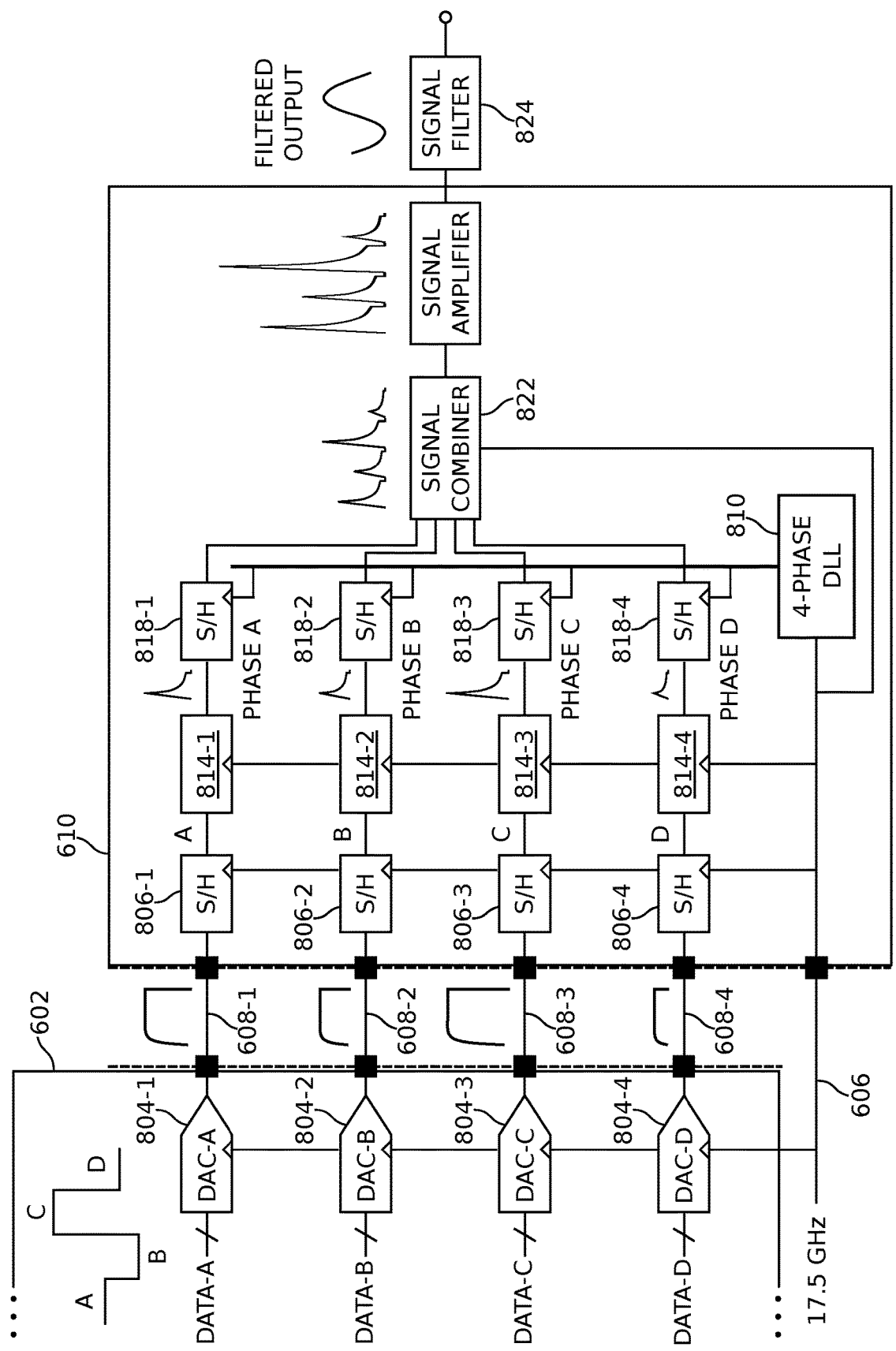
FIG. 17 is a diagram of an exemplary multi-zone digital-to-analog device, showing the processing of analog domain pulse shapes.

FIG. 17 is a diagram of an exemplary multi-zone digital-to-analog device, showing the processing of analog domain pulse shapes. In this example, the interleaving factor (N) is 4, the clock frequency (P) is 17.5 GHz, and the impulse pulses have a pulse with of 25% or 1/(17.5 GHz×4). The digital signal is decomposed (deinterleaved) into 4 channels and sent across the chip-to-chip boundary on lines 608-1 through 608-4 as an analog signal. The analog signal is sampled and converted to a scaled pulse value. The pulse is defined with a narrow pulse width to allow for 4× interleaving of 4 pulses (A, B, C, and D) in one 17.5 GHz period. This is done by the second tier of sample-hold devices 818-1 through 818-4 using clock phases derived from the delay-locked loop. The pulses are aggregated in the signal combiner 822 and amplified and filtered as needed. In this example, the upsampling stage 610 includes an optional amplifier 1600. Although not shown as such, the bandpass filter 824 may be located on the upsampling stage die. In another aspect not shown, signal filters may be added between the D/A stage (e.g., CMOS chip) and upsampling stage (e.g., SiGe chip), which serve to reduce the sensitivity of the sampling event between the chips. Smoothing out the analog waveform removes the settling artifacts which can distort the captured signal. Once the analog signal value is captured, it is converted to a pulse as before.

Figure 18:
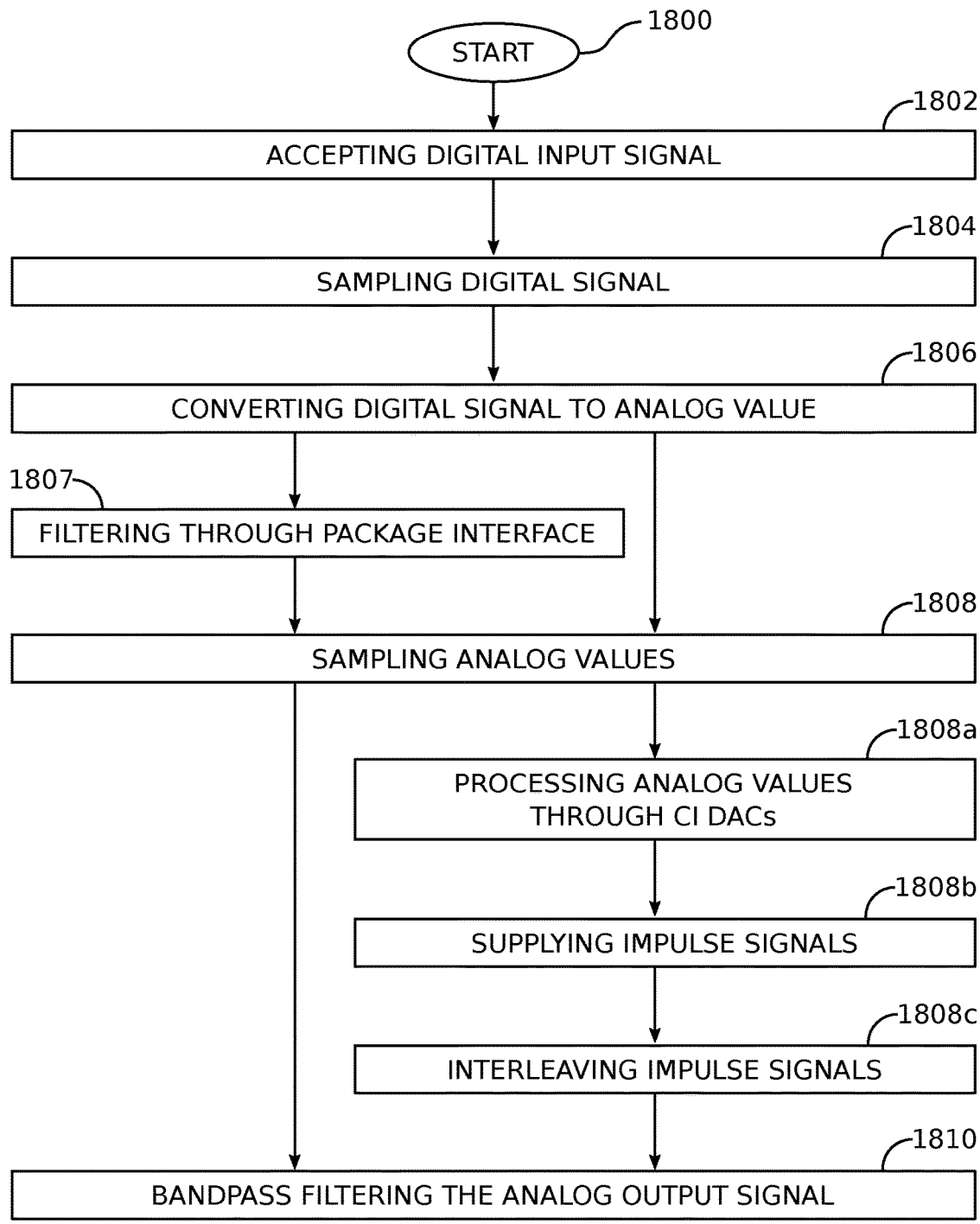
FIG. 18 is a flowchart illustrating a method for multi-zone digital-to-analog conversion.

FIG. 18 is a flowchart illustrating a method for a multi-zone digital-to-analog conversion. Although the method is depicted as a sequence of numbered steps for clarity, the numbering does not necessarily dictate the order of the steps. It should be understood that some of these steps may be skipped, performed in parallel, repeated, or performed without the requirement of maintaining a strict order of sequence. Generally however, the method follows the numeric order of the depicted steps, and the details of the method are supported by the explanations of the figures above. The method starts at Step 1800.

Step 1802 accepts a digital input signal with a data bandwidth of M Hz. Step 1804 samples the digital signal at a rate of P Hz. Step 1806 converts the digital signal to an analog value having a bandwidth of M Hz. Step 1808 samples the analog value to supply an analog output signal with a full power bandwidth of K Hz, where (P/2)=M and M<K. As a result, Step 1808 supplies analog output signal images in a plurality of Nyquist zones. In one aspect, sampling the digital signal in Step 1804 includes creating N deinterleaved digital values. Then, converting the digital signal in Step 1806 includes converting the N deinterleaved digital values to N deinterleaved analog values having a combined bandwidth of M Hz, where N×(P/2)=M. Step 1810 filters the analog output signal to supply a filtering output signal having a bandwidth of M Hz, located in the full power bandwidth K.

In another aspect, subsequent to converting the N deinterleaved digital values to N deinterleaved analog values in Step 1806, Step 1807 filters each deinterleaved analog values through a packaging interface having a bandwidth of less than M Hz, or even a bandwidth of less than P Hz.

In one aspect, sampling the analog value in Step 1808 includes substeps. Step 1808*a* processes the N deinterleaved analog values through a bank of N CI DACs at a rate of P Hz. In Step 1808*b* the CI DACs supply N corresponding impulse signals at the rate of P Hz. Step 1808*c* interleaves the N impulse signals at a rate of (N×P) Hz to supply the analog output signal. In one variation, supplying the impulse signals in Step 1808*b* includes the impulse signals having a RMS pulse width duration of less than or equal to 1/(N×P).

Figure 19A:
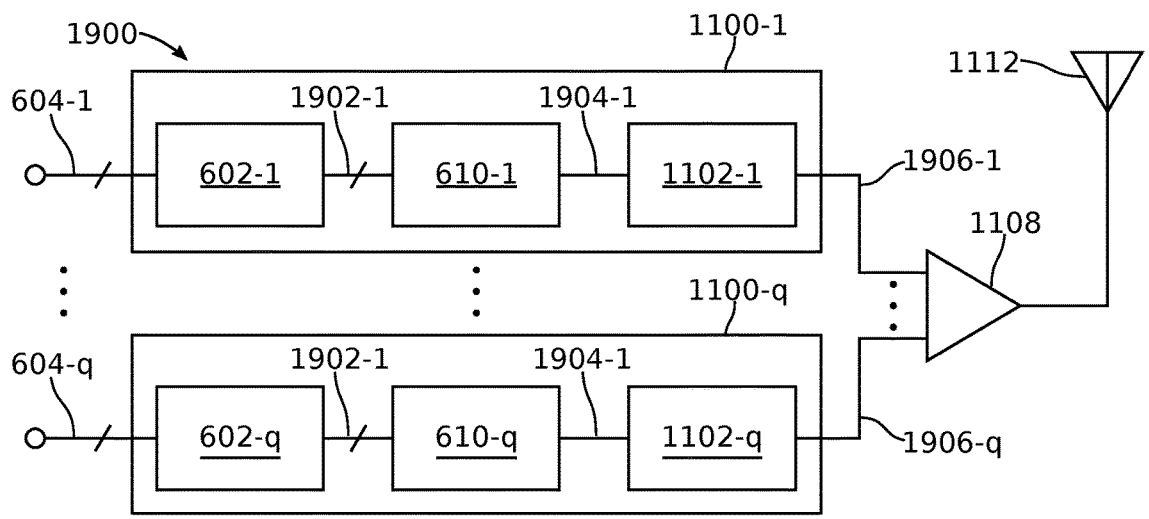
FIGS. 19A and 19B are, respectively, a schematic block diagram and an associated frequency spectrum of a multi-zone transmitter with a plurality of transmitter sections.

FIGS. 19A and 19 B are, respectively, a schematic block diagram and an associated frequency spectrum of a multi-zone transmitter 1900 with a plurality of transmitter sections. Parallel transmitter sections 1100-1 through 1100-*q* are shown. Each transmitter section comprises a D/A stage (602-1 through 602-*q* are shown) having an input to accept an independent digital input signal on line 604-1 through 604-*q* with an independent data bandwidth, respectively of $R_1$ through $R_Q$ Hz. The digital signals and their bandwidths are said to be "independent" in that they may be different from each (include different data). The digital input signals may include the same information for redundancy, or different information to increase the overall data rate. The D/A stages 602-1 through 602-*q* have outputs on lines 1902-1 through 1902-*q* to supply a corresponding analog value having corresponding bandwidths of $R_1$ through $R_Q$ Hz. Each transmitter section also includes an upsampling stage (610-1 through 610-*q* are shown) having an input to accept the corresponding analog value on lines 1902-1 through 1902-*q*, and an output with a device bandpass of L Hz to supply a corresponding analog output signal on lines 1904-1 through 1904-*q* in the full power bandwidth of K Hz.

Likewise, each transmitter section 1100-1 through 1100-*q* includes a bandpass filter (1102-1 through 1102-*q* are shown) having an input to accept the corresponding analog output signal on lines 1904-1 through 1904-*q*, and an output to supply a filtered signal on lines 1906-1 through 1906-*q* with a corresponding bandwidth of $R_1$ through $R_Q$ Hz in a predetermined Nyquist zone. Here, the filtered signals are shown all directly connected to the input of PA 1108. Alternatively but not shown, the filtered signals can be connected to the PA input via independent switches. As another alternative not shown, each transmitter section may have its own PA and antenna.

Figure 19B:
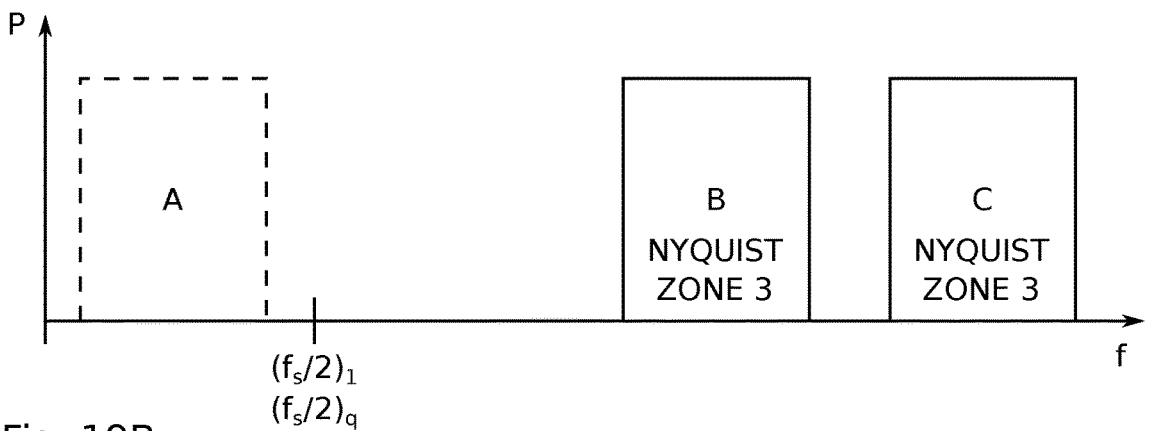

As shown in FIG. 19B, bandpass filters 1102-1 through 1102-*q* of FIG. 19A supply corresponding filtered signals in adjacent bandwidths. Signal A (in phantom) shows the fundamental signals on both line 1904-1 and 1904-*q*. For simplicity it is assumed that the bandwidth of both signals is the same (e.g., $R_1=R_Q=M$). Signal B is the third Nyquist zone signal on line 1906-1 after filtering. Signal C is the third Nyquist zone signal on line 1906-*q* after filtering. The analog output signal Nyquist zones are responsive to the selection of clock frequency, or interleaving factor, or a combination of clock frequency and interleaving factor. In this example the interleaving factor of transmitter section 1100-*q* (Signal C) is greater than the interleaving factor of transmitter section 1100-1 (Signal B).

A system and method have been provided for a multi-zone DAC, a multi-zone DAC transmitter, and a multi-zone transceiver. Examples of particular structures and device types have been presented to illustrate the invention. However, the invention is not limited to merely these examples. Other variations and embodiments of the invention will occur to those skilled in the art.

We claim:

1. A multi-Nyquist zone digital-to-analog device comprising:

a first semiconductor substrate with a digital-to-analog (DIA) stage having an input to accept a digital input signal with a data bandwidth of M Hertz (Hz), and an output to supply an analog value having a bandwidth of M Hz; and, a second semiconductor substrate with an upsampling stage having an input to accept the analog value, and an output to supply an analog output signal in a Qth Nyquist zone, where Q is an integer greater than 1 and each Nyquist zone has a bandwidth of M Hz.

2. The multi-Nyquist zone digital-to-analog device of claim 1 wherein the D/A stage further comprises a clock input to accept a first clock signal with a frequency of P Hz, and supplies N deinterleaved analog values having a combined bandwidth of M Hz, where N×(P/2)=M.

3. The multi-Nyquist zone digital-to-analog device of claim 1 wherein the upsampling stage supplies analog output signal images in a plurality of Nyquist zones within a full power bandwidth of K Hz.

4. The multi-Nyquist zone digital-to-analog device of claim 2 wherein the D/A stage further comprises:

N packaging interfaces respectively connecting the analog values from the D/A stage output to the upsampling stage input, each packaging interface having a bandwidth of less than M Hz.

5. The multi-Nyquist zone digital-to-analog device of claim 1 wherein the upsampling stage has a device bandwidth of L Hz and a full power bandwidth of K Hz, where M<K<L.

6. The multi-Nyquist zone digital-to-analog device of claim 2 wherein the upsampling stage has a clock input to accept a second clock signal, having a frequency of P Hz, for interleaving the N deinterleaved analog values.

7. The multi-Nyquist zone digital-to-analog device of claim 6 wherein the D/A stage comprises:

a deinterleaver having a signal input to accept the digital input signal, a clock input to accept the first clock signal, and an output to supply N deinterleaved digital values;

a bank of N digital-to-analog converters (DACs), each DAC having a signal input to accept a corresponding deinterleaved digital value, a clock input to accept the second clock signal, and a signal output to supply a corresponding deinterleaved analog value;

wherein the upsampling stage comprises:

a bank of N first sample-and-hold (S/H) circuits, each first S/H circuit having an input to accept a corresponding deinterleaved analog value, a control port to accept the second clock signal, and an output to supply a corresponding sampled analog value;

a delay-locked loop having an input to accept the second clock signal, and an output to supply the N phases of the clock frequency;

a bank of N current impulse (CI) DACs, each CI DAC having an input to accept a corresponding sampled analog value, a control port to accept the second clock signal, and an output to supply a corresponding impulse signal;

a bank of N second S/H circuits, each second S/H circuit having an input to accept a corresponding impulse signal, a control port to accept a corresponding second clock phase, and an output to supply a corresponding sampled impulse signal; and, an interleaver having an input to accept the N sampled impulse signals and an output to supply the analog output signal.

8. The multi-Nyquist zone digital-to-analog device of claim 7 wherein the D/A stage DACs are zero-order hold DACs supplying analog values having a pulse width duration of 1/P; and,
wherein the CI DACs supply impulse signals having a root mean square (RMS) pulse width duration of less than or equal to 1/(N×P).

9. The multi-Nyquist zone digital-to-analog device of claim 1 further comprising:
a bandpass selectable filter having an input to accept the analog output signal and an output to supply a bandpass-filtered analog output signal in a predetermined Nyquist zone.

10. A multi-Nyquist zone digital-to-analog device comprising:
the digital-to-analog device having an input to accept a digital input signal with a data bandwidth of M Hertz (Hz), and an output to supply an analog output signal in a Qth Nyquist zone, where Q is an integer greater than 1 and each Nyquist zone has a bandwidth of M Hz.

11. The multi-Nyquist zone digital-to-analog device of claim 10 wherein the input accepts N deinterleaved digital input signals having a combined bandwidth of M Hz.

12. The multi-Nyquist zone digital-to-analog device of claim 11 wherein the digital-to analog device further comprises a clock input to accept a clock signal with a frequency of P Hz, where N×(P/2)=M.

13. The multi-Nyquist zone digital-to-analog device of claim 10 wherein the digital-to-analog device has a device bandwidth of L Hz and the output supplies an analog output signal with a full power bandwidth of K Hz, where 3M<K<L.

14. The multi-Nyquist zone digital-to-analog device of claim 10 wherein the analog output signal includes signal images in a plurality of Nyquist zones within a full power bandwidth of K Hz.

15. The multi-Nyquist zone digital-to-analog device of claim 12 further comprising:
a bank of N first sample-and-hold (S/H) circuits, each first S/H circuit having a signal input to accept a corresponding deinterleaved digital value, a clock input, and a signal output to supply a corresponding sampled analog value;
a delay-locked loop having an input to accept the clock signal, and an output to supply N phases of the clock frequency;
a bank of N current impulse (CI) digital-to-analog converters (DACs), each CI DAC having an input to accept a corresponding sampled analog value, a control port to accept the clock signal, and an output to supply a corresponding impulse signal;
a bank of N second S/H circuits, each second S/H circuit having an input to accept a corresponding impulse signal, a control port to accept a corresponding clock phase, and an output to supply a corresponding sampled impulse signal; and,
an interleaver having an input to accept the N sampled impulse signals and an output to supply the analog output signal.

16. The multi-Nyquist zone digital-to-analog device of claim 15 wherein the CI DACs supply impulse signals having a root mean square (RMS) pulse width duration of less than or equal to 1/(N×P).

17. The multi-Nyquist zone digital-to-analog device of claim 10 further comprising:
a bandpass filter having an input to accept the analog output signal, and an output to supply a filtered signal with a bandwidth of M Hz in a predetermined Nyquist zone.

18. A method for multi-Nyquist zone digital-to-analog conversion, the method comprising:
a digital-to-analog (D/A) stage accepting a digital input signal with a data bandwidth of M Hertz (Hz);
the D/A stage converting the digital signal to an analog value having a bandwidth of M Hz; and,
an upsampler stage sampling the analog value to supply an analog output signal in a Qth Nyquist zone, where Q is an integer greater than 1 and each Nyquist zone has a bandwidth of M Hz.

19. The method of claim 18 further comprising:
the D/A stage sampling the digital signal to create N deinterleaved digital values; and,
wherein converting the digital signal includes converting the N deinterleaved digital values to N deinterleaved analog values having a combined bandwidth of M Hz,
wherein sampling the analog value comprises:
processing the N deinterleaved analog values through a bank of N current impulse (CI) DACs at a rate of P Hz; and,
interleaving the N impulse signals to supply the analog output signal.

20. The method of claim 18 wherein sampling the analog value includes supplying analog output signal images in a plurality of Nyquist zones within a full power bandwidth of K Hz.

* * * * *

UNITED STATES PATENT AND TRADEMARK OFFICE
CERTIFICATE OF CORRECTION

PATENT NO. : 10,498,350 B2
APPLICATION NO. : 16/012858
DATED : December 3, 2019
INVENTOR(S) : Kappes et al.

Page 1 of 1

It is certified that error appears in the above-identified patent and that said Letters Patent is hereby corrected as shown below:

In the Claims

In Claim 1, at Column 14, Line 2, the phrase "(DIA)" should be "(D/A)".

In Claim 18, at Column 16, Line 24, the phrase "(DIA)" should be "(D/A)".

Signed and Sealed this
Twenty-first Day of April, 2020

Andrei Iancu
*Director of the United States Patent and Trademark Office*